(12) United States Patent
Tsai et al.

(10) Patent No.: US 11,366,155 B2
(45) Date of Patent: *Jun. 21, 2022

(54) CHIP TESTING DEVICE AND CHIP TESTING SYSTEM FOR TESTING MEMORY CHIPS

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS

( * ) Notice: Subject to any disclaimer, the term of this patent is extended or adjusted under 35 U.S.C. 154(b) by 162 days.

This patent is subject to a terminal disclaimer.

(21) Appl. No.: 16/847,668

(22) Filed: Apr. 14, 2020

(65) Prior Publication Data

US 2021/0132140 A1    May 6, 2021

(30) Foreign Application Priority Data

Nov. 1, 2019 (TW) ................................ 108139813

(51) Int. Cl.
*G01R 31/28* (2006.01)
*G11C 29/56* (2006.01)

(52) U.S. Cl.
CPC ..... *G01R 31/2817* (2013.01); *G01R 31/2863* (2013.01); *G11C 29/56* (2013.01)

(58) Field of Classification Search
CPC ............................ G01R 1/0458; G01R 1/0483; G01R 31/2817; G01R 31/2863; G01R 31/2867; G11C 2029/5002; G11C 29/006; G11C 29/06; G11C 29/50; G11C 29/56; G11C 29/56016; H04B 1/02

See application file for complete search history.

(56) References Cited

U.S. PATENT DOCUMENTS

| 6,742,144 B2* | 5/2004 | Co | G11C 29/028 714/42 |
| 6,932,635 B2* | 8/2005 | Ishikawa | G01R 31/01 439/190 |
| 7,049,841 B2* | 5/2006 | Yamashita | G01R 31/2868 324/750.09 |
| 7,919,974 B2* | 4/2011 | Yamashita | G01R 31/31905 324/757.01 |
| 9,024,648 B2* | 5/2015 | Horino | G01R 31/2893 324/750.13 |

(Continued)

*Primary Examiner* — Vinh P Nguyen
(74) *Attorney, Agent, or Firm* — Li & Cai Intellectual Property Office

(57) ABSTRACT

A chip testing device and a chip testing system are provided. The chip testing system includes a chip testing device and a plurality of environment control apparatuses. A plurality of electrical connection sockets are disposed on one side of a circuit board, and a plurality of testing modules are disposed on another side of the circuit board. A first fixing member and a second fixing member fix the electrical connection sockets on one side of the circuit board, and no screwing members are required to be screwed between the electrical connection sockets and the circuit board. Each of the electrical connection sockets with a chip disposed thereon can be disposed in a high temperature environment or a low temperature environment for testing along with the chip testing device, so that each of the chips does not need to be detached repeatedly.

18 Claims, 31 Drawing Sheets

(56) References Cited

U.S. PATENT DOCUMENTS

| | | | | |
|---|---|---|---|---|
| 9,229,041 B2* | 1/2016 | Wang | ................ | G01R 31/2834 |
| 9,360,499 B2* | 6/2016 | Lee | ................ | G01R 31/2808 |
| 10,222,413 B2* | 3/2019 | Matsumoto | ........ | G01R 31/2891 |
| 11,119,147 B2* | 9/2021 | Tsai | ................ | G01R 31/2862 |

* cited by examiner

CHIP TESTING DEVICE AND CHIP TESTING SYSTEM FOR TESTING MEMORY CHIPS

CROSS-REFERENCE TO RELATED PATENT APPLICATION

This application claims the benefit of priority to Taiwan Patent Application No. 108139813, filed on Nov. 1, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip testing device and a chip testing system, and more particularly to a chip testing device and a chip testing for testing memory chips.

BACKGROUND OF THE DISCLOSURE

In general, a memory chip needs to pass a high temperature test and a burn-in test, or needs to pass a high temperature test, a burn-in test, and a low temperature test before leaving the factory. When a conventional memory chip testing apparatus performs a high temperature test, a low temperature test, and a burn-in test on a memory chip, the memory chip is repeatedly detached from and mounted to different electrical connection sockets. However, such repeated detachment and mounting of the memory chip in the testing process can easily result in waste of time, low testing efficiency, and damage to contacts of the memory of the memory chip.

SUMMARY OF THE DISCLOSURE

In response to the above-referenced technical inadequacies, the present disclosure provides a chip testing device and a chip testing system to effectively improve on issues associated with conventional memory chip testing apparatuses. As a result of a memory chip being repeatedly detached and mounted by the conventional memory chip testing apparatuses when being tested in environments having different temperatures, contacts of the memory chip are easily damaged, and the testing efficiency is low.

In one aspect, the present disclosure provides a chip testing device for carrying a plurality of chips and being transferred among a plurality of working stations through a transferring device. The chip testing device includes a circuit board, a fixing assembly, a plurality of electrical connection sockets, a control set, and at least one power supply member. The circuit board has a first board surface and a second board surface respectively defined by two opposite sides thereof. The circuit board includes a plurality of positioning holes and a plurality of circuit board screwing holes, each of the positioning holes does not penetrate through the circuit board, and each of the circuit board screwing holes penetrates through the circuit board. The fixing assembly includes a first fixing member and a second fixing member. The first fixing member is disposed on the first board surface, and the second fixing member is disposed on the second board surface. The first fixing member includes a plurality of first screwing holes, the second includes a plurality of second screwing holes, and the circuit board holes and the second screwing holes are correspondingly disposed. A plurality of screwing members are screwed at the first screwing holes, the circuit board holes, and the second screwing holes, and the circuit board is fixed between the first fixing member and the second fixing member. Each of the electrical connection sockets includes a socket body. One side of each of the socket bodies is configured to carry one of the chips. Each of the socket bodies includes at least two positioning members at another side of each of the socket bodies. The positioning members are engaged with the positioning holes, and each of the electrical connection sockets is fixed onto the first board surface of the circuit board. The first fixing member includes a plurality of pressing structures, the pressing structures correspondingly press on a part of the electrical connection sockets, and each of the electrical connection sockets is pressed by the first fixing member to be fixed onto the first board surface of the circuit board. The first fixing member includes a plurality of thru-holes, and a part of each of the electrical connection sockets is correspondingly exposed from one of the thru-holes. The control set is disposed on the second board surface of the circuit board. The control set includes a plurality of testing modules, and each of the testing modules is connected to a part of the socket groups. The second fixing member includes a plurality of avoidance holes, and parts of the testing modules penetrate through the avoidance holes. The at least one power supply member is connected to the circuit board. The chip testing device is connected to an external power supply apparatus through the at least one power supply member so as to receive electricity for an operation of each of the testing modules, and the external power supply apparatus is connected to at least one of the working stations. When the chip testing device receives electricity provided from the external power supply apparatus through the at least one power supply member, each of the testing modules is allowed to perform a predetermined testing process on at least one of the chips disposed on the at least one of the electrical connection sockets of the corresponding socket group connected thereto.

In one aspect, the present disclosure provides a chip testing system. The chip testing system includes a chip testing device, a central control device, and an environment control apparatus. The chip testing device includes a circuit board, a fixing assembly, a plurality of electrical connection sockets, a control set, and at least one power supply member. The circuit board has a first board surface and a second board surface respectively defined by two opposite sides thereof. The circuit board includes a plurality of positioning holes and a plurality of circuit board screwing holes, each of the positioning holes does not penetrate through the circuit board, and each of the circuit board screwing holes penetrates through the circuit board. The fixing assembly includes a first fixing member and a second fixing member. The first fixing member is disposed on the first board surface, the second fixing member is disposed on the second board surface, the first fixing member includes a plurality of first screwing holes, the second includes a plurality of second screwing holes, and the circuit board holes and the second screwing holes are correspondingly disposed. A plurality of screwing members are screwed at the first screwing holes, the circuit board holes, and the second screwing holes, and the circuit board is fixed between the first fixing member and the second fixing member. Each of the electrical connection sockets includes a socket body. One side of each of the socket bodies is configured to carry one of the chips. Each of the socket bodies includes at least two positioning members at another side of each of the socket bodies. The positioning members are engaged with the positioning holes, and each of the electrical connection sockets is fixed onto the first board surface of the circuit board. The first fixing member includes a plurality of pressing structures, the pressing structures correspondingly press on a part of the electrical connection sockets, and each of the electrical connection sockets is pressed by the first fixing member to be fixed onto the first board surface of the circuit board. The first fixing member includes a plurality of thru-holes, and a part of each of the electrical connection sockets is correspondingly exposed from one of the thru-holes. The control set is disposed on the second board surface of the circuit board. The control set includes a plurality of testing modules, and each of the testing modules is connected to a part of the socket groups. The second fixing member includes a plurality of avoidance holes, and parts of the testing modules penetrate through the avoidance holes. The at least one power supply member is connected to the circuit board. The environment control apparatus includes an apparatus body, an air suction device, and a plurality of temperature adjusting devices. The apparatus body includes a plurality of accommodating chambers and is configured to connect to an external power supply apparatus. Another power supply member is disposed in each of the accommodating chambers, and the power supply member in each of the accommodating chambers is connected to the external power supply apparatus. The air suction device is connected to each of the accommodating chambers and the central control device. The air suction device is controllable by the central control device to suction away air around the chips carried by the chip testing device. The temperature adjusting devices are disposed on the apparatus body. The number of the temperature adjusting devices disposed in each of the accommodating chambers is one. Each of the temperature adjusting devices is controllable by the central control device to increase or decrease a temperature around the chips carried by the chip testing device. When the chip testing device is disposed in one of the accommodating chambers, the external power supply apparatus is configured to provide electricity to the chip testing device through the power supply member in the accommodating chamber and the power supply member of the chip testing device. When the external power supply apparatus provides electricity to the chip testing device, each of the testing modules is configured to perform a predetermined testing process on at least one of the chips carried by the at least one of the electrical connection sockets.

Therefore, the chip testing device and the chip testing system including the chip testing device of the present disclosure applied to a memory chip test can be used to carry a plurality of chips and can be transferred to a high temperature environment or a low temperature environment (e.g., in accommodating chambers of environment control apparatuses) through a relevant robotic arm, so that the chips can be tested after providing electricity to the chip testing device. In other words, when the chips are tested in the high temperature environment or the low temperature environment, the chips do not need to be detached from the electrical connection sockets. Accordingly, the chip testing device of the present disclosure can be used to effectively reduce a testing time of the chips, and can be used to prevent the issues associated with conventional memory chip testing apparatuses from occurring.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
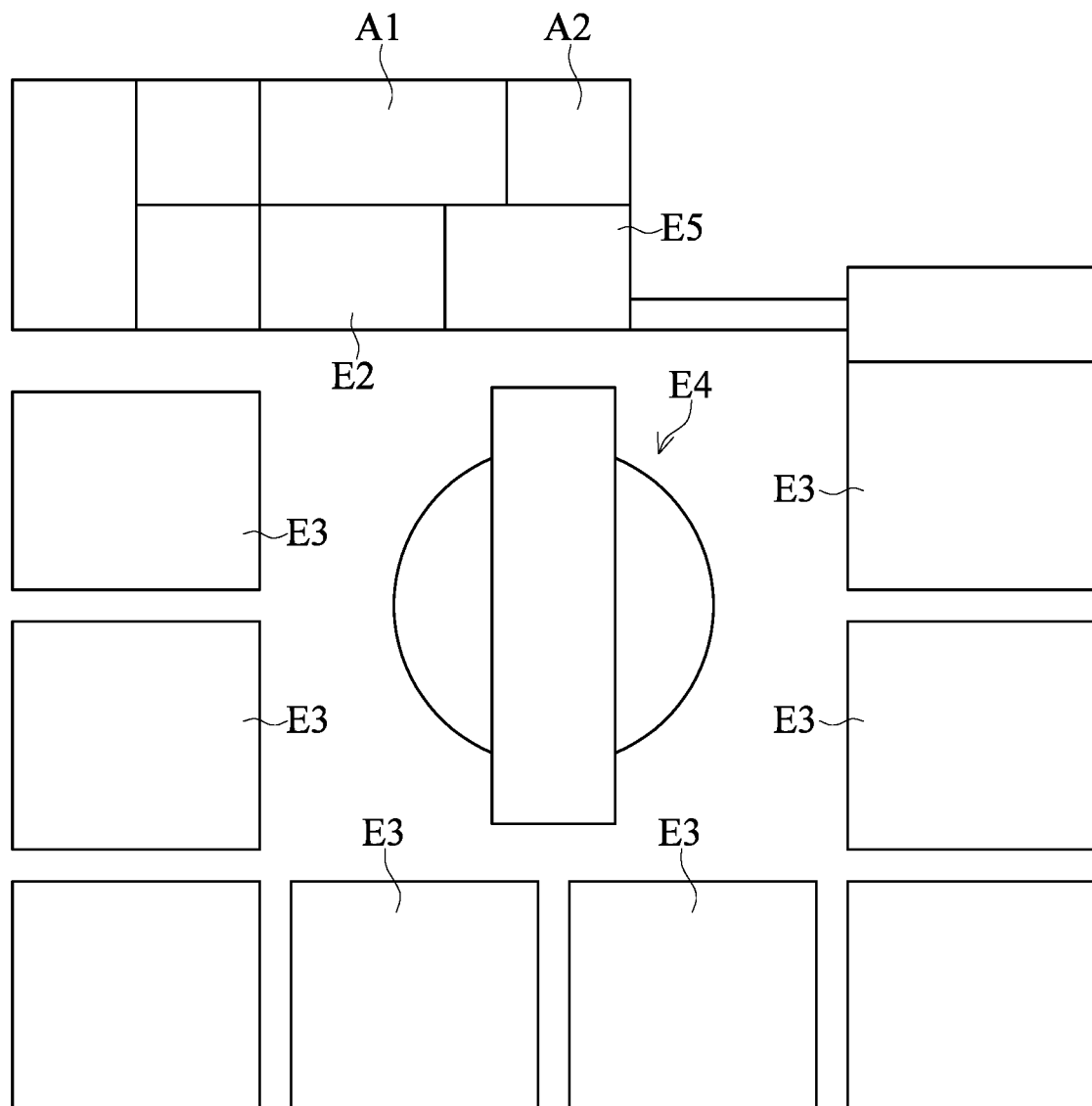
FIG. 1 is a schematic view of a chip testing system according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
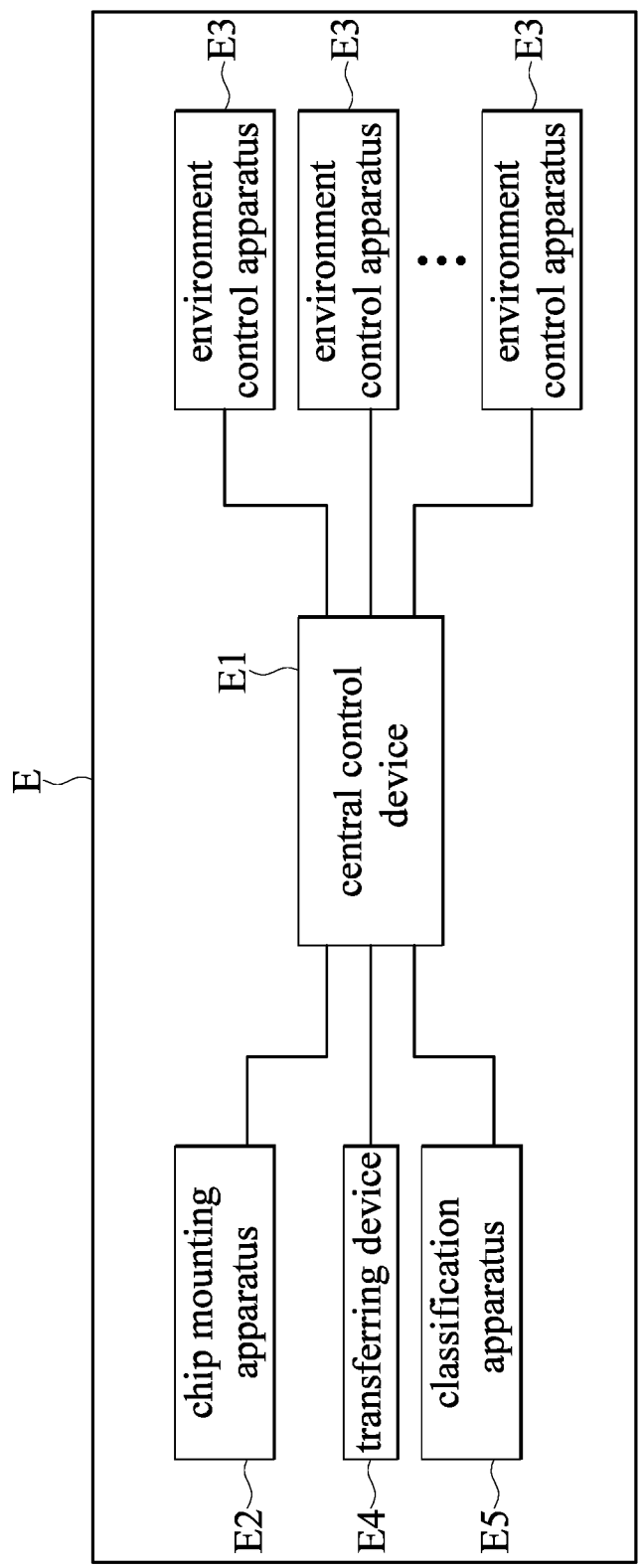
FIG. 2 is a functional block view of the chip testing system according to the present disclosure.
Figure 3:
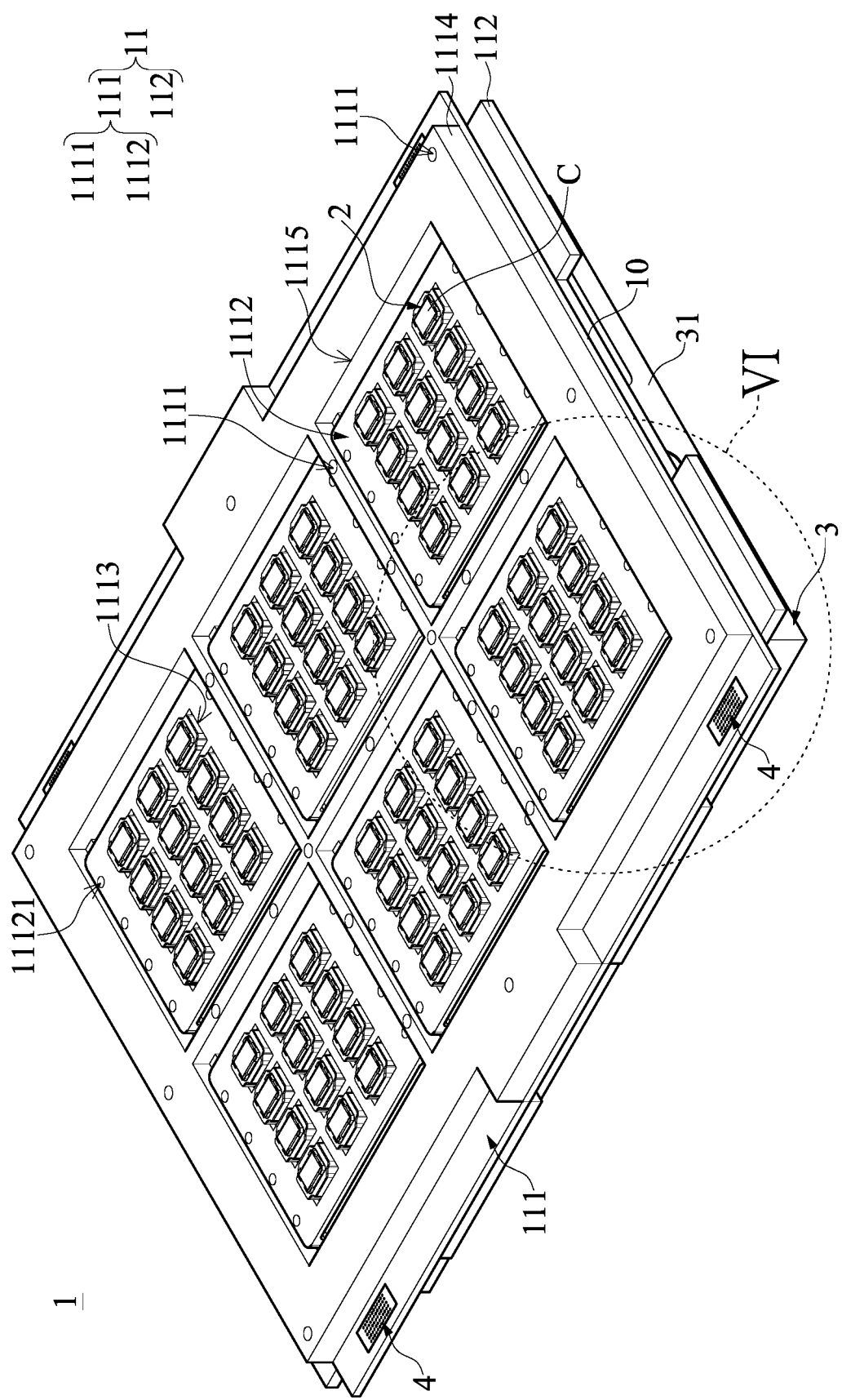
FIG. 3 is a schematic view of a chip testing device according to the present disclosure.
Figure 4:
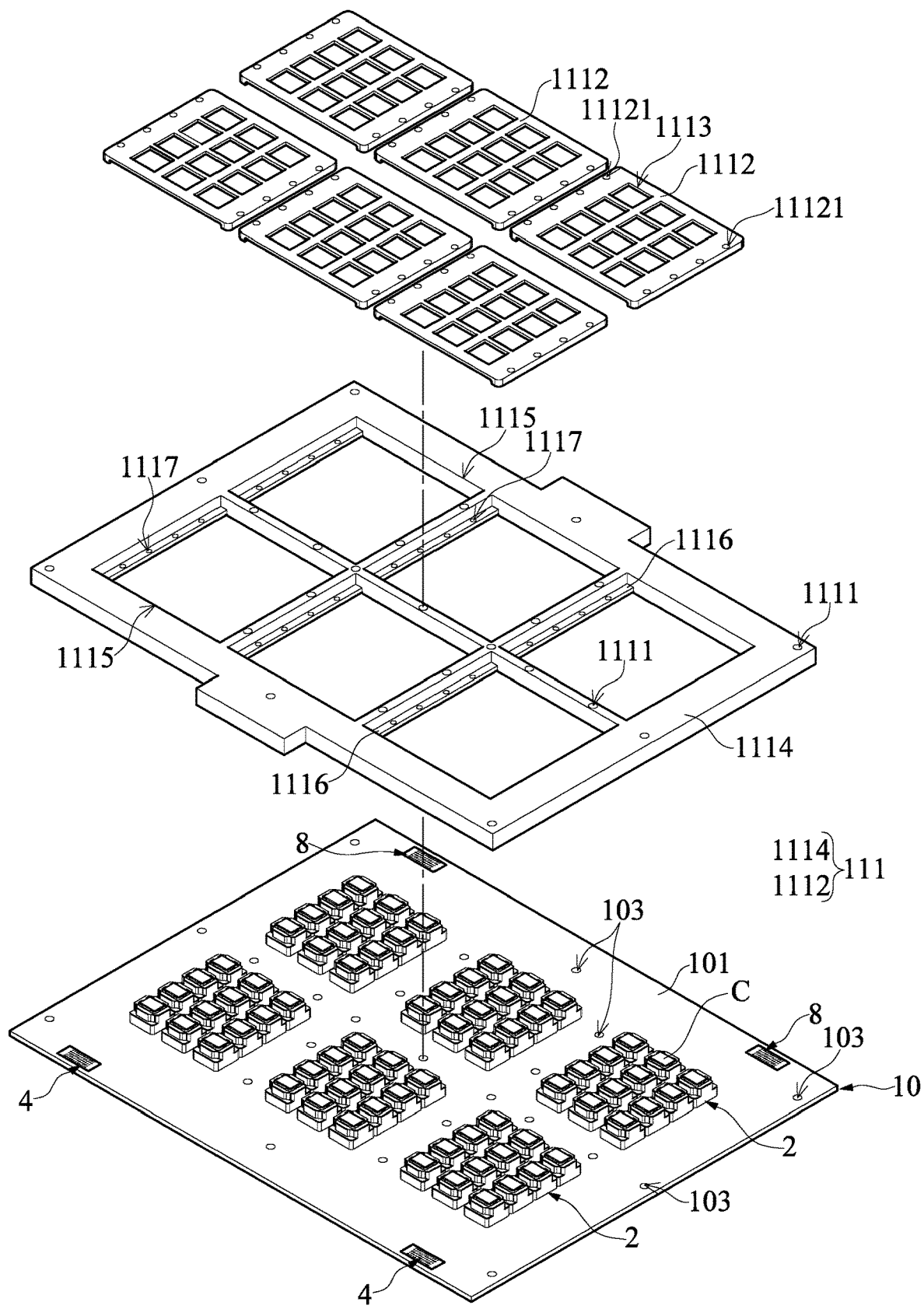
FIG. 4 is a partial exploded view of the chip testing device according to the present disclosure.
Figure 5:
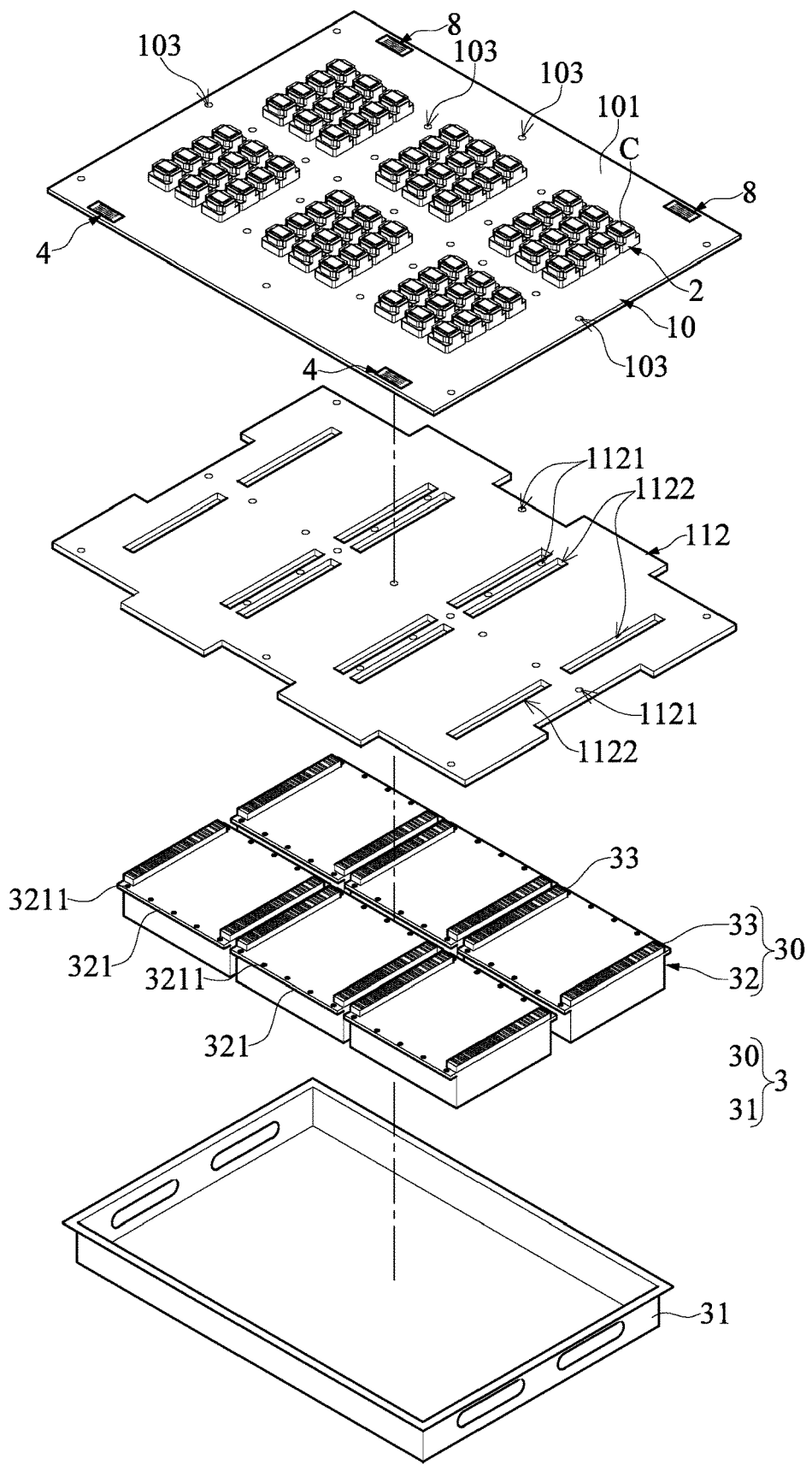
FIG. 5 is another partial exploded view of the chip testing device according to the present disclosure.

Referring to FIG. 1 to FIG. 5, FIG. 1 is a schematic view of a chip testing system according to the present disclosure, FIG. 2 is a functional block view of the chip testing system according to the present disclosure, FIG. 3 is a schematic view of a chip testing device according to the present disclosure, and FIG. 4 and FIG. 5 are partial exploded views of the chip testing device according to the present disclosure. The chip testing system E of the present disclosure is configured to test a plurality of chips C. The chip testing system E includes a central control device E1, a chip mounting apparatus E2, at least one chip testing device 1, a plurality of environment control apparatuses E3, a transferring apparatus E4, and a classification apparatus E5.

Figure 17:
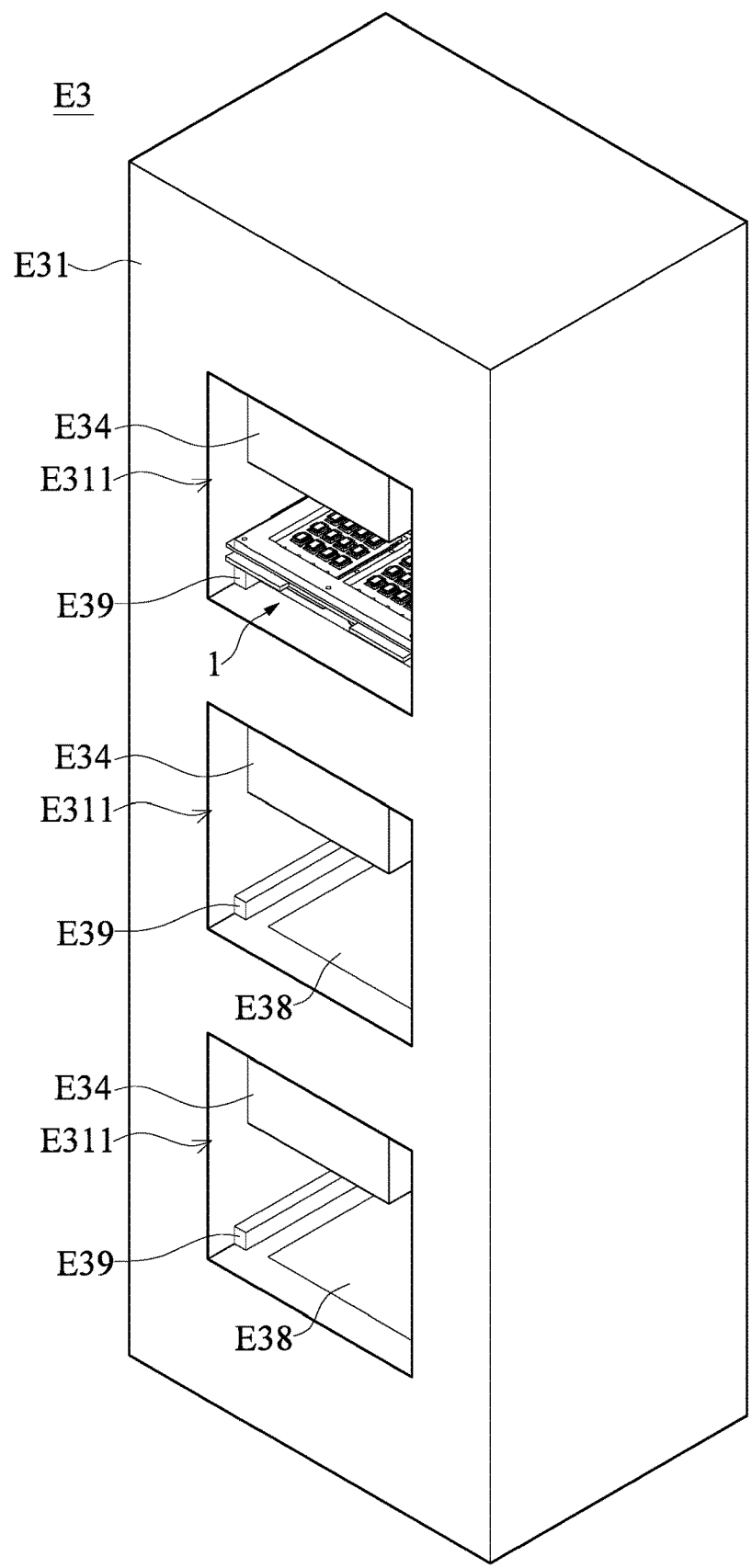
FIG. 17 is a schematic view of an environment apparatus of the chip testing system according to the present disclosure.

The central control device E1 is connected to the chip mounting apparatus E2, the environment control apparatuses E3, the transferring apparatus E4, and the classification apparatus E5. The central control device E1 can control the operation of each of the above apparatuses. The central control device E1 can be a server or a computer apparatus, but the present disclosure is not limited thereto. In a practical application, the central control device E1 can include a plurality of environment status control devices (such as any type of processors or computers), and one of the environment status control devices can be correspondingly disposed in an apparatus body E31 (as shown in FIG. 17) of each of the environment control apparatuses E3. That is to say, the number of the environment status control devices included by each of the environment control apparatuses E3 can be one. The chip mounting apparatus E2 can include a robotic arm (not shown) that is controllable by the central control device E1 to transfer the chips C one by one from a tray onto a plurality of electrical connection sockets 2 of the chip testing device 1.

The chip testing device 1 is configured to carry the chips C, and can be moved among a plurality of working stations (e.g., the chip mounting apparatus E2, the environment control apparatuses E3, the transferring apparatus E4, and the classification apparatus E5) by the transferring apparatus E4.

Figure 9:
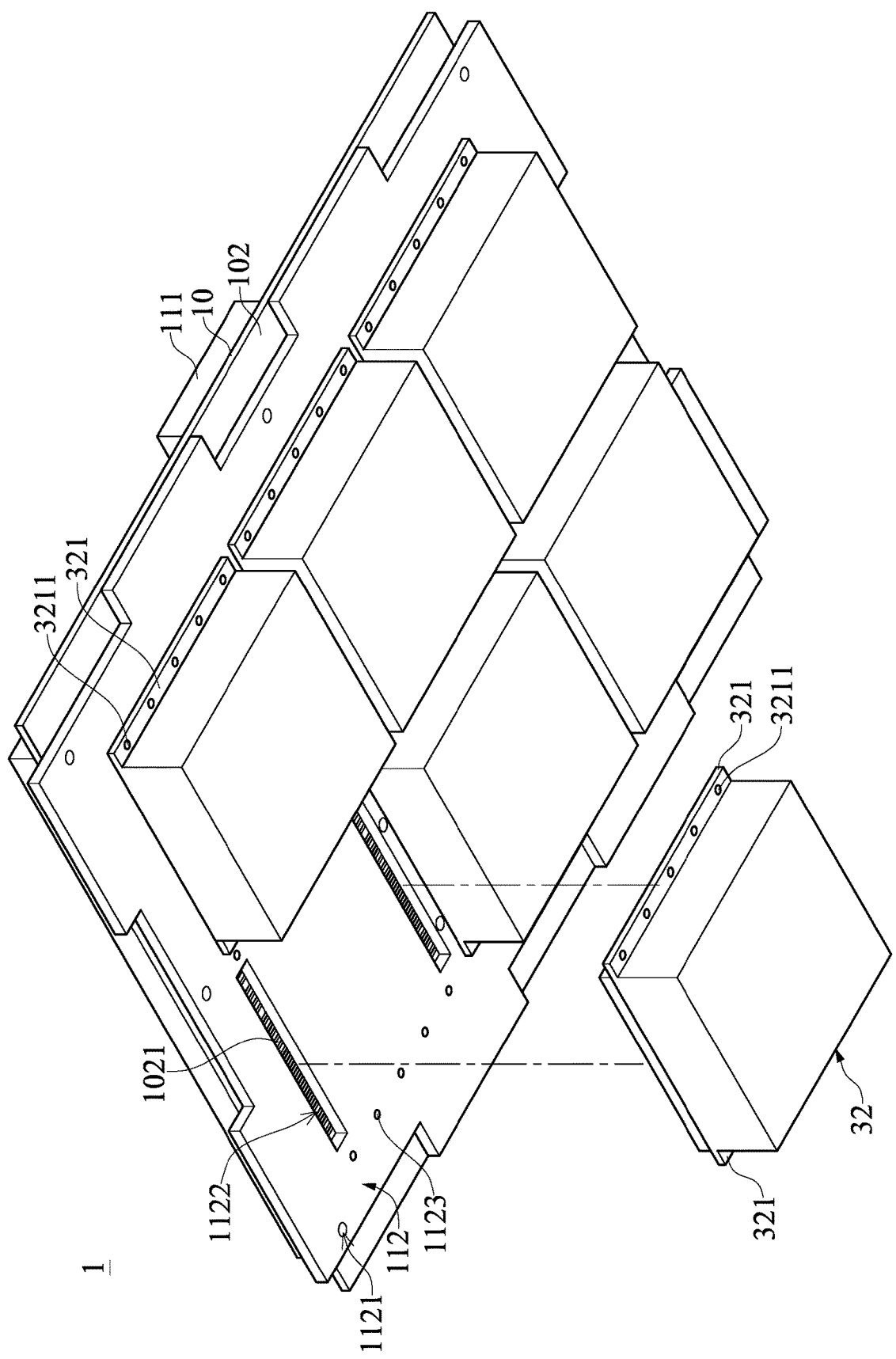
FIG. 9 is an exploded view of a plurality of testing modules, the circuit board, and a second fixing member of the chip testing device according to the present disclosure.

As shown in FIG. 3 to FIG. 5, the chip testing device 1 includes a circuit board 10, a fixing assembly 11, the electrical connection sockets 2, a control set 3, and at least one power supply member 4. The circuit board 10 has a first board surface 101 and a second board surface 102 respectively defined by two opposite sides thereof (as shown in FIG. 9). The electrical connection sockets 2 are fixed onto the first board surface 101 of the circuit board 10, and each of the electrical connection sockets 2 is configured to carry one of the chips C. The structure of the electrical connection sockets 2 can be changed according to that of the chips C, and the present disclosure is not limited thereto.

The fixing assembly 11 includes a first fixing member 111 and a second fixing member 112. The first fixing member 111 is disposed onto the first board surface 101, and the second fixing member 112 is fixed onto the second board surface 102. The first fixing member 111 has a plurality of first screwing holes 1111, the second fixing member 112 has a plurality of second fixing holes 1121, and the circuit board 10 has a plurality of circuit board screwing holes 103. Each of the first screwing holes 1111 penetrates through the first fixing member 111, each of the second screwing holes 1121 penetrates through the second fixing member 112, and each of the circuit board screwing holes 103 penetrates through the circuit board 10. The first screwing holes 1111, the second screwing holes 1121, and the circuit board screwing holes are correspondingly arranged. In a practical application, the number, structure, and distribution of the first screwing holes 1111, the second screwing holes 1121, and the circuit board screwing holes 103 can be changed according to practical requirements. FIG. 3, FIG. 4, and FIG. 5 show only one of the embodiments.

A plurality of screwing members (not shown, such as screws) are screwed at the first screwing holes 1111, the circuit board screwing holes 103, and the second screwing holes 1121. That is to say, the circuit board 10 is fixed between the first fixing member 111 and the second fixing member 112. Through the first fixing member 111 and the second fixing member 112, the overall structure of the circuit board 10 can be strengthened. In a practical application, the first fixing member 111 and the second fixing member 112 can be made of materials with high hardness such as stainless steel. The circuit board 10 can be only penetrated by each of the circuit board screwing holes 103 without other holes penetrating though the circuit board 10.

It is worth mentioning that in a practical application, each of the first screwing holes 111 can be provided to not penetrate through the first fixing member 111 and can be a blind hole. Or, some of the first screwing holes 111 can penetrate through the first fixing member 111 and the other first screwing holes 111 are blind holes. In response to the first screwing holes 111 being blind holes, the corresponding second screwing holes 1121 are thru-holes penetrating through the second fixing member 112. In contrast, in response to the first screwing holes being thru-holes, the second screwing holes 1121 can be blind holes. In other words, each of the second screwing holes 1121 can be provided to not penetrate through the second fixing member 112 and can be a blind hole. Or, some of the second screwing holes 1121 can be thru-holes and the other second screwing holes 1121 can be blind holes.

Figure 6:
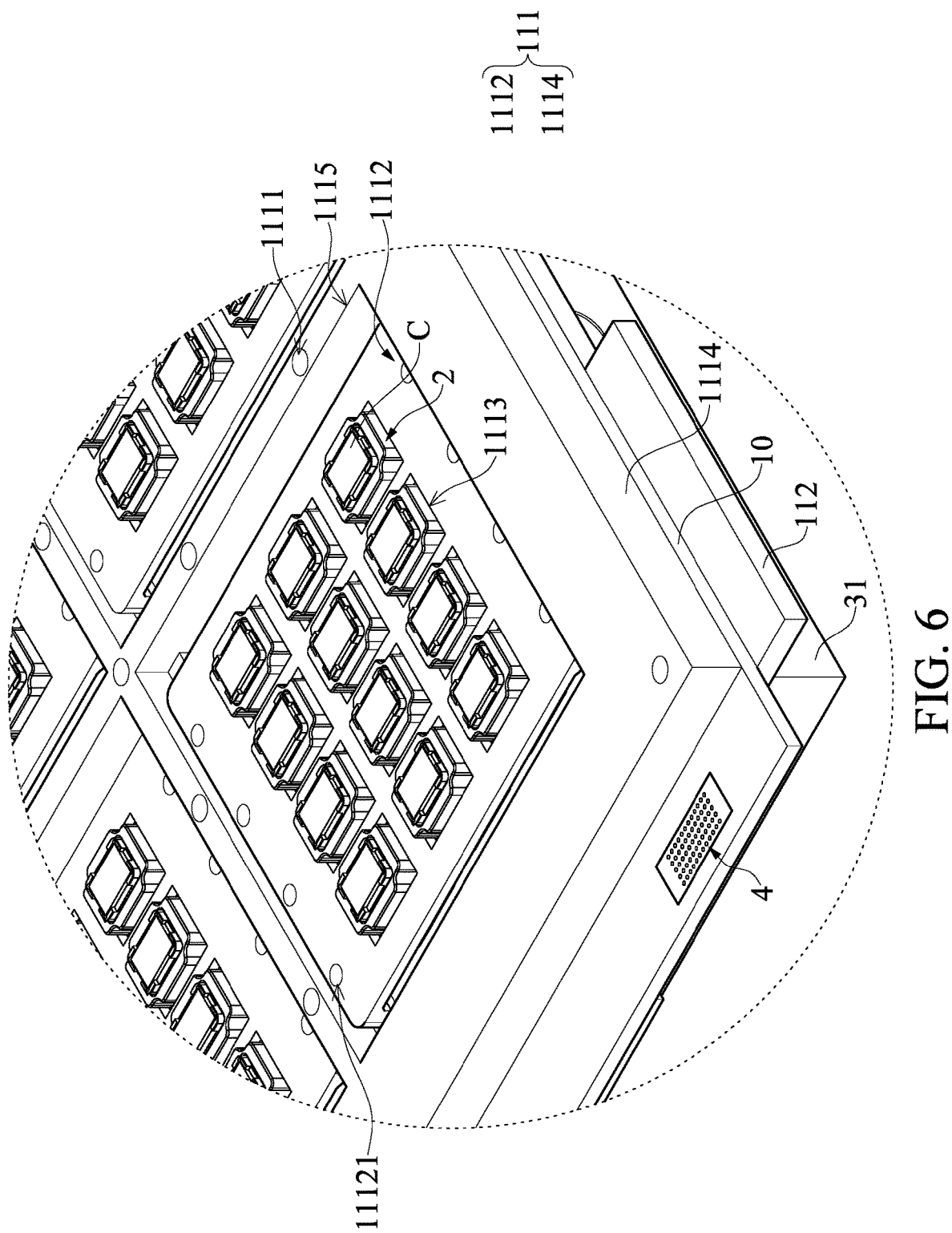
FIG. 6 is a partial enlarged view of the chip testing device according to the present disclosure.
Figure 7:
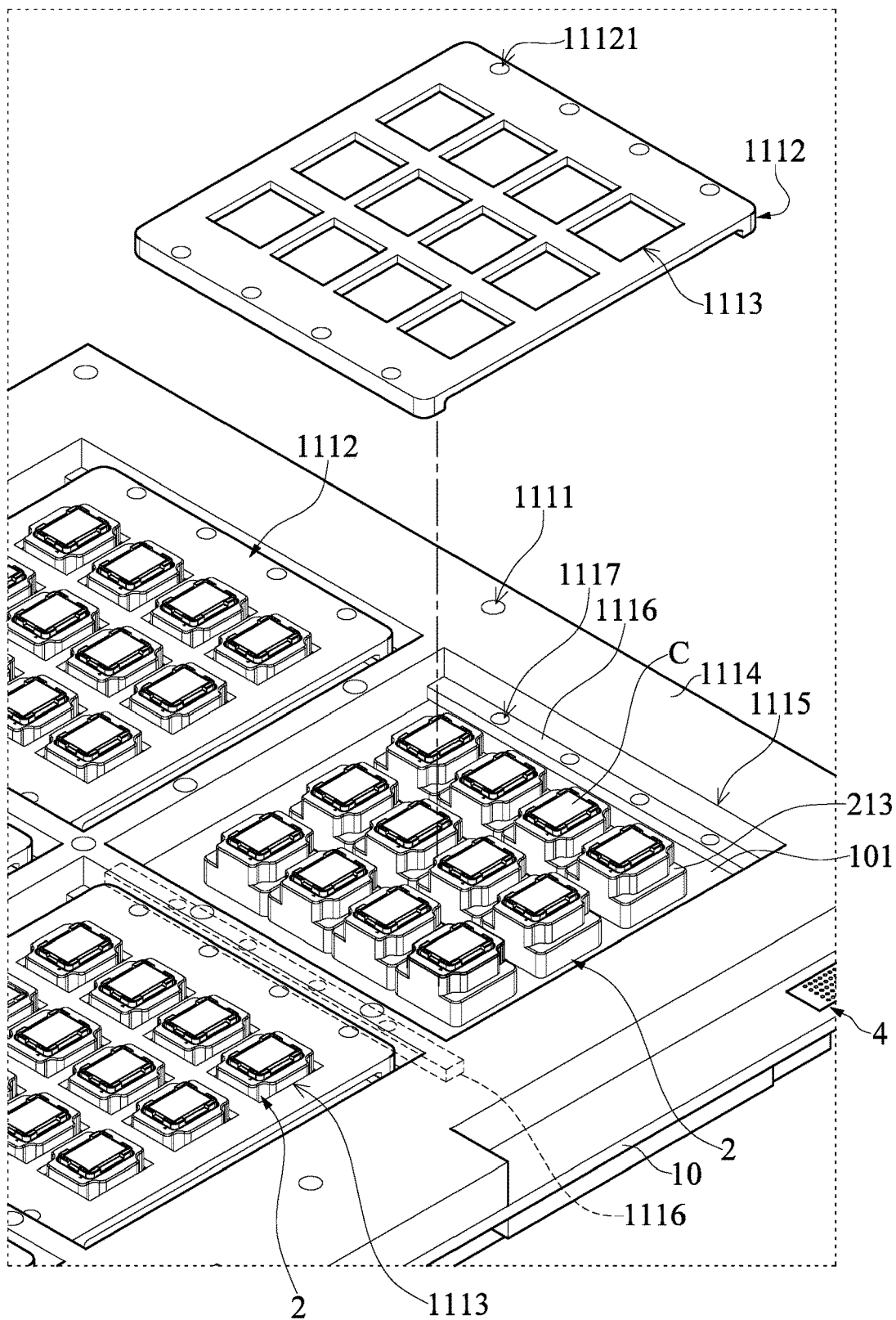
FIG. 7 is an exploded view of a plurality of pressing structures and a fixing body of the chip testing device according to the present disclosure.

Referring to FIG. 4, FIG. 6, and FIG. 7, FIG. 6 is a partial enlarged view of the chip testing device according to the present disclosure, and FIG. 7 is an exploded view of a plurality of pressing structures and a fixing body of the chip testing device according to the present disclosure. In a practical application, the first fixing member 111 can include a plurality of pressing structures 1112 and a fixing body 1114. Each of the pressing structures 1112 and the fixing body are independent from each other, and each of the pressing structures 1112 are detachably fixed to the fixing body 1114. Each of the pressing structures 1112 is substantially in a fence shape, and each of the pressing structures 1114 has a plurality of thru-holes 1113 correspondingly formed thereon. When the first fixing member 111 is fixed onto the first board surface 101 of the circuit board 10, the pressing structures 1112 correspondingly press on a part of the socket bodies 21 of the electrical connection sockets 2, and a part of the electrical connection sockets 2 is exposed from the thru-holes 1113. That is to say, the first fixing member 111 can not only cooperate with the second fixing member 112 to hold the circuit board 10, the first fixing member 111 can also allow the electrical connection sockets 2 disposed on the first board surface 101 to be fixed onto the first board surface 101 of the circuit board 10.

The fixing body 1114 includes a plurality of group accommodating holes 1115, and each of the group accommodating holes 1115 penetrates and is fixed to the fixing body 1114. Each of the group accommodating holes 1115 is configured to accommodate the electrical connection sockets 2. The fixing body 1114 further includes a plurality of auxiliary fixing portions 1116. Each of the auxiliary fixing portions 1116 is defined from a side wall of each of the auxiliary fixing portions 1116 toward a central region of each of the auxiliary fixing portions 1116. When the fixing body 1114 is fixed to the circuit board 10, a height of each of the auxiliary fixing portions 1116 corresponding to the circuit board 10 is less than a depth of each of the group accommodating holes 1115.

Each of the pressing structures 1112 and each of the auxiliary fixing portions 1116 respectively have a plurality of corresponding screwing holes 11121, 1117, and each of the pressing structures 1112 can be screwed on the auxiliary fixing portion 1116 of each of the group accommodating holes 1115 through the screwing members (not shown, such as screws). When the pressing structures 1112 and the auxiliary fixing portions 1116 are screwed with each other, the pressing structures 1112 correspondingly press on a plurality of abutting portions 213 (as shown in FIG. 7 and described below) of the socket bodies 21 of the electrical connection sockets 2 in the group accommodating holes 1115, and parts of the electrical connection sockets 2 are correspondingly exposed from the thru-holes 1113 on the pressing structures 1112. As shown in FIG. 6, in the present embodiment, when the first fixing member 111 is fixed to the circuit board 10, one side of the pressing structures 1112 away from the circuit board 10 is lower than one side of the fixing body 1114 away from the circuit board 10. That is to say, a height between one side of the pressing structures 1112 away from the circuit board 10 and one side of the circuit board 10 with electrical connection sockets 2 disposed thereon is lower than a height between one side of the fixing body 1114 away from the circuit board 10 and one side of the circuit board 10 with electrical connection sockets 2 disposed thereon, but the present disclosure is not limited thereto. In other embodiments of the present disclosure, one side of the pressing structures 1112 away from the circuit board 10 can be flush with one side of the fixing body 1114 away from the circuit board 10.

According to the above, since the first fixing member 111 is screwed on the first board surface 101 of the circuit board 10 through the screwing members, and the pressing structures 1112 of the first fixing member 111 correspondingly press on a part of each of the electrical connection sockets 2, each of the electrical connection sockets 2 can be pressed to be fixed to the circuit board 10 by the first fixing member 111 without screws.

Figure 8:
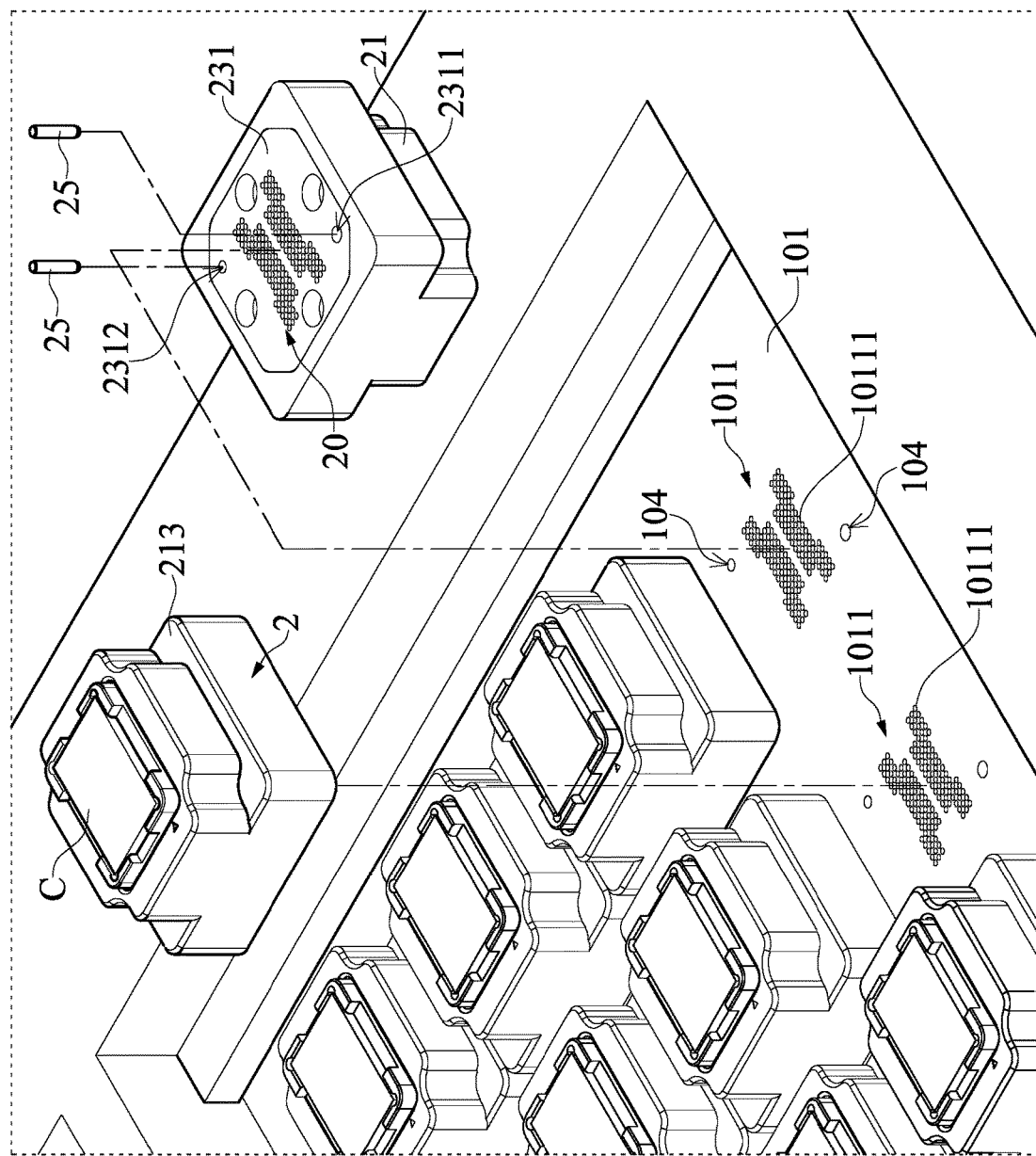
FIG. 8 is an exploded view of a plurality of electrical connection sockets and a circuit board of the chip testing device according to the present disclosure.

Referring to FIG. 6 to FIG. 8, FIG. 8 is an exploded view of a plurality of electrical connection sockets and a circuit board of the chip testing device according to the present disclosure. The circuit board 10 has a plurality of groups of electrical contacting structures 1011 formed on the first board surface 101 thereof (FIG. 8 only shows two groups of the electrical contacting structures 1011, but the number of the electrical contacting structures 1011 corresponds to the number of the electrical connection sockets 2). Each of the groups of the electrical contacting structures 1011 includes a plurality of contacting pads 10111 (such as metal pad). When each of the electrical connection sockets 2 is pressed by the pressing structure 1112 and fixed onto the first board surface 101 of the circuit board 10, one end of each of a plurality of probe assemblies 20 (described below) of the electrical connection sockets 2 correspondingly presses on the contacting pads 10111 included by one of the groups of the electrical contacting structures 1011. Therefore, when the chip testing device 1 is provided with electricity, the probe assemblies 20 of the electrical connection sockets 2 can be electrically connected to electrical components disposed on the circuit board 10 through the contacting pads

10111. The number, arrangement, disposed positions of the electrical contacting structures 1011 and the number, structure, arrangement of the contacting pads 10111 of each of the groups of the electrical contacting structures 1011 can be changed according to practical requirements. FIG. 6, FIG. 7, and FIG. 8 show only one of the embodiments.

It is worth mentioning that in the above description, the pressing structures 1112 and the fixing body 1114 are independent from each other. However, in a practical application, the pressing structures 1112 and the fixing body 1114 can be integrally formed. That is to say, the first fixing member 111 is overall in a fence shape.

In a practical application, each of the contacting pads 10111 can be flatly formed on the first board surface 101 of the circuit board 10 so that each of the electrical connection sockets 2 can be correctly disposed on each of the groups of the electrical contacting structures 1011 by related personnel or machines, and the first board surface 101 of the circuit board 10 at an outer periphery of each of the groups of contacting structures can recess to form at least two positioning holes 104, and each of the at least two positioning holes 104 does not penetrate through the circuit board 10. Correspondingly, one side of each of the electrical connection sockets 2 configured to be abutted against the first board surface 101 of the circuit board 10 can correspondingly have a positioning member 25, and the positioning members 25 are engaged with the positioning holes 104. Therefore, through the cooperation of the positioning members 25 and the positioning holes 104, the electrical connection sockets 2 can be correctly disposed on each of the groups of the electrical contacting structures 1011 by the related personnel or machines. In a practical application, the positioning member 25 and each of the electrical connection sockets 2 can be independent from each other. Or, the positioning member 25 and a seat structure 231 of each of the electrical connection sockets 2 can be integrally formed.

As mentioned above, each of the electrical connection sockets 2 is disposed on the first board surface 101 of the circuit board 10 only through being pressed by the pressing structure 1112. Therefore, when assembling the electrical connection sockets 2, the first fixing member 111, the second fixing member 112, and the circuit board 10, the first fixing member 111 is fixed onto the first board surface 101 of the circuit board 10 after the electrical connection sockets 2 are disposed on the first board surface 101 of the circuit board 10. Each of the electrical connection sockets 2 is retained at a certain positon through the positioning members 25 and the positioning holes 104 so that each of the electrical connection sockets 2 does not easily move relatively to the circuit board 10 and the first fixing member 111 can be easily fixed onto the first board surface 101 of the circuit board 10 by the related personnel or machines. The number of the positioning members 25 disposed between one of the electrical connection sockets 2 and the circuit board 10 is not limited to be two as shown in FIG. 8. The number of the positioning members 25 can be changed according to practical requirements, and the structures of the positioning members 25 and the positioning holes 104 can be changed according to practical requirements.

According to the above, the chip testing device 1 of the present disclosure takes advantages of the first fixing member 111 and the second fixing member 112 cooperating with the screwing members to hold and fix the electrical connection sockets 2 onto the first board surface 101 of the circuit board 10 so that each of the electrical connection sockets 2 and the circuit board 10 are not mutually screwed by other screwing members. Therefore, the number of the thru-holes of the circuit board 10 can be effectively decreased.

Referring to FIG. 5 and FIG. 9, FIG. 9 is an exploded view of a plurality of testing modules, the circuit board, and a second fixing member of the chip testing device according to the present disclosure. The control set 3 is disposed on the second board surface 102 of the circuit board 10. The control set 3 includes a plurality of testing modules 30, and each of the testing modules 30 is fixed onto the second board surface 102 of the circuit board 10. The second fixing member 112 includes a plurality of avoidance holes 1122. When the second fixing member 112 is fixed onto the second board surface 102 of the circuit board 10, a part of each of the testing modules 30 penetrates through the corresponding avoidance holes 1122.

In a practical application, the second board surface 102 of the circuit board 10 can include a plurality of first contacting structures 1021. Each of the testing modules 30 can include a testing module body 32 and two second contacting structures 33. Electrical components are disposed inside of the testing module body 32 to perform tests on one of the chips C. The second contacting structures 33 are exposed from one side of the testing module body 32, the second contacting structures 33 of each of the testing module bodies 32 are configured to be in contact with the first contacting structures 1021 of the circuit board 10.

When the second contacting structures 33 of each of the testing modules 30 are in contact with the first contacting structures 1021 of the circuit board 10, the related electrical components in each of the testing modules 30 can be in contact with related electrical components disposed on the circuit board 10. In a practical application, the first contacting structures 1021 and the second contacting structures 22 can be board-to-board connectors having pogo pins or reeds, but the present disclosure is not limited thereto. The number of the second contacting structures 33 included by each of the testing modules 30 is not limited to be two and can be changed according to types of the second contacting structures 33.

Through the design of the first contacting structures 1021 and the second contacting structures 33, each of the testing modules 30 is detachably fixed onto the second board surface 102 of the circuit board 10. Because each of the testing modules 30 is detachably fixed onto the second board surface 102 of the circuit board 10, each of the testing modules 30 can be changed according to practical requirements by users, and the particular testing modules 30 can be easily detached or maintained by related maintenance staff Referring to FIG. 5 and FIG. 9, in a practical application, the testing module body 32 can include two auxiliary fixing structures 321. Each of the auxiliary fixing structures 321 can include a plurality of fixing holes 3211, and the second fixing member 112 can correspondingly include a plurality of fixing holes 1123. Each of the testing module bodies 32 can cooperate with fixing holes 3211 and the fixing holes 1123 through the screwing members (e.g., screws) so that each of the testing modules 30 is detachably fixed to the second fixing member 112. In a practical application, the auxiliary fixing structures 321 and the testing module bodies 32 can be integrally formed. Or, the auxiliary fixing structures 321 can be components (e.g., angle steel structures) independent from the testing module bodies 32. Naturally, the testing module bodies 32 are not limited to be screwed on the second fixing structure 112 by the screws. Any methods that the testing module bodies 32 can be detachably assembled on the second fixing member 112 are within the scope of the present embodiment. For example, the testing module bodies 32 and the second fixing member 112 can respectively include engaging structures to be engaged with each other, and the testing module bodies 32 and the second fixing member 112 can be mutually fixed through the engaging structures.

Referring to FIG. 3, in a practical application, the electrical connection sockets 2 can be divided into a plurality of socket groups, each of the socket groups includes at least one of the electrical connection sockets 2, and each of the testing modules 30 is connected to the at least one electrical connection socket 2 of the corresponding socket group. For example, referring to FIG. 3 of the present embodiment, the number of the electrical connection sockets 2 disposed onto the circuit board 10 is seventy two, the seventy two electrical connection sockets 2 can be divided into six socket groups, and each of the socket groups has twelve of the electrical connection sockets 2. The twelve electrical connection sockets 2 of each of the socket groups are disposed in one of a plurality of group accommodating holes 1115, and the twelve electrical connection sockets 2 of each of the socket groups are connected to one of the testing modules 30. In other words, the circuit board 10 shown in FIG. 5 is provided with six testing modules 30. In addition, the number of the electrical connection sockets 2 on the circuit board 10 and the number of the socket groups can be changed according to practical requirements.

Referring to FIG. 6, it should be noted that through the design of the pressing structures 1112 and the fixing body 1114, each of the electrical connection sockets 2 is directly fixed to the circuit board 10 in a pressing manner, and each of the socket groups is correspondingly pressed by one of the pressing structures 1112. Therefore, when any one of the electrical connection sockets 2 fails, the broken electrical connection socket 2 can be taken off and replaced by the related personnel through removing the screws between the pressing structure 1112 corresponding to the broken electrical connection socket and the fixing body 1114. That is to say, through the design of the pressing structures 1112 and the fixing body 1114, the particular electrical connection socket 2 can be easily repaired, replaced and mounted by the related personnel or machines.

When each of the testing modules 30 is supplied with electricity, any one of the testing modules 30 can perform a predetermined testing process on the chips C on the electrical connection sockets 2 connected thereto. For example, the chip C can be a memory chip (e.g., an NAND flash memory chip), and each of the testing modules 30 can test the memory chip by at least one of a reading test, a writing test, and an electrical property test. In an embodiment of the present disclosure about each of the testing modules 30 used for testing the memory chip, each of the testing modules 30 can include a pattern generator 30a (PG), parametric measurement unit (PMU) a device power supplies (DPS), and a driver.

Since the electrical connection sockets 2 on the circuit board 10 are respectively connected to the testing modules 30, a signal transmission between any one of the testing modules 30 and the chips C on the corresponding electrical connection sockets 2 can be faster and decay is less likely to occur. Specifically, if the circuit board 10 provided with the seventy two electrical connection sockets 2 is only connected to a single signal input source, and when signal emitted from the signal input source to the circuit board 10, the signal would have a decay issue that may cause a test inaccurate result of chip.

In a practical application, the electrical connection sockets 2 of each of the socket groups can be connected in a parallel connection, and are connected to the same testing module 30. In other words, the electrical connection sockets 2 connected to any one of the testing modules 30 are connected in a parallel connection. In addition, any one of the electrical connection sockets 2 of one of the socket groups is not connected to any one of the electrical connection sockets 2 of another one of the socket groups. For example, four electrical connection sockets 2 (i.e., Z1, Z2, Q1, and Q2) disposed on the circuit board 10 are divided into two socket groups that are respectively defined as a first socket group and a second socket group. The first socket group includes the two electrical connection sockets Z1, Z2 that are connected in a parallel connection, and the second socket group includes the two electrical connection sockets Q1, Q2 that are connected in a parallel connection. Specifically, the electrical connection socket Z1 is not connected to the two electrical connection sockets Q1, Q2, and the electrical connection socket Z2 is not connected to the two electrical connection sockets Q1, Q2.

The electrical connection sockets 2 respectively belonging to different socket groups are not connected to each other. When the chip testing device 1 fails, the socket groups can be can be tested one by one to quickly find a broken electrical connection socket 2, and the chip testing device 1 can be repaired by simply replacing the broken electrical connection socket 2, components of the broken electrical connection socket 2, the socket group having the broken electrical connection socket 2, or the testing module 30 corresponding to the broken electrical connection socket 2. Accordingly, the chip testing device 1 can be repaired without replacing all of the electrical connection sockets 2 and all of the testing modules 30 both on the circuit board 10.

As shown in FIG. 5, in a practical application, the chip testing device 1 can further include a chassis 31 fixed to the second fixing member 112 so that the chassis 31 correspondingly covers and protects the testing modules 30. In a practical application, the chassis 31 can be provided with a heat dissipating device (e.g., a fan or heat dissipation fins) according to design requirements. As shown in FIG. 5 of the present embodiment, the number of the chassis 31 of the chip testing device 1 is only one, and the chassis 31 covers the testing modules 30, but the number of the chassis 31 of the chip testing device 1 of the present disclosure is not limited to one. In other embodiments of the present disclosure, the chip testing device 1 can include a plurality of chassis 31, and each of the chassis 31 can cover the same number (e.g., one, two, or three) of the testing modules 30.

Referring to FIG. 4 to FIG. 6, the power supply member 4 is connected to the circuit board 10, and can be connected to the testing modules 30 through the circuit board 10. The power supply member 4 can be a board-to-board connector having pogo pins or reeds, but the present disclosure is not limited thereto. As shown in FIG. 4 of the present embodiment, the power supply member 4 includes a plurality of connection terminals, the power supply member 4 is disposed on the first board surface 101 and is exposed from the first fixing member 111, but the configuration, number of the power supply member 4, and position where the power supply member 4 is disposed on the circuit board 10 are not limited of what shown in FIG. 4.

The power supply member 4 is configured to be connected to an external power supply apparatus P that can provide electricity to each of the testing modules 30 through the power supply member 4, the first contacting structures 1021 (as shown in FIG. 9), and the second contacting structures 33 (as shown in FIG. 5). The external power supply apparatus P is independent from the chip testing device 1 and can be any apparatus capable of providing electricity, but the present disclosure is not limited thereto. Moreover, when the chip testing device 1 is not connected to the external power supply apparatus P through the power supply member 4, each of the testing modules 30 does not have electricity to perform a predetermined testing process on the chips C connected thereto. Naturally, in other embodiments of the present disclosure, the chip testing device 1 can be provided with at least one battery connected to the testing modules 30, and the at least one battery can provide electricity to the testing modules 30.

In an embodiment of the present disclosure, the power supply member 4 can include a receiving antenna, and can receive electricity in a wireless manner so as to provide electricity to each of the testing modules 30. Moreover, the chip testing device 1 can include a charging battery module connected to the power supply member 4, and the power supply member 4 can receive electricity in a wireless manner so as to provide electricity to the charging battery module. Specifically, electricity for driving each of the testing modules 30 to test the chips C can be provided from the charging battery module or the external power supply apparatus P through the receiving antenna (i.e., the power supply member 4). The power supply member 4 can be not exposed from the chip testing device 1, and is embedded in the circuit board 10 or arranged in the chip testing device 1. In addition, the number of the power supply member 4 of the chip testing device 1 is not limited to one, and can be changed according to design requirements. For example, the number of the power supply member 4 of the chip testing device 1 can be two or at least two.

Figure 10:
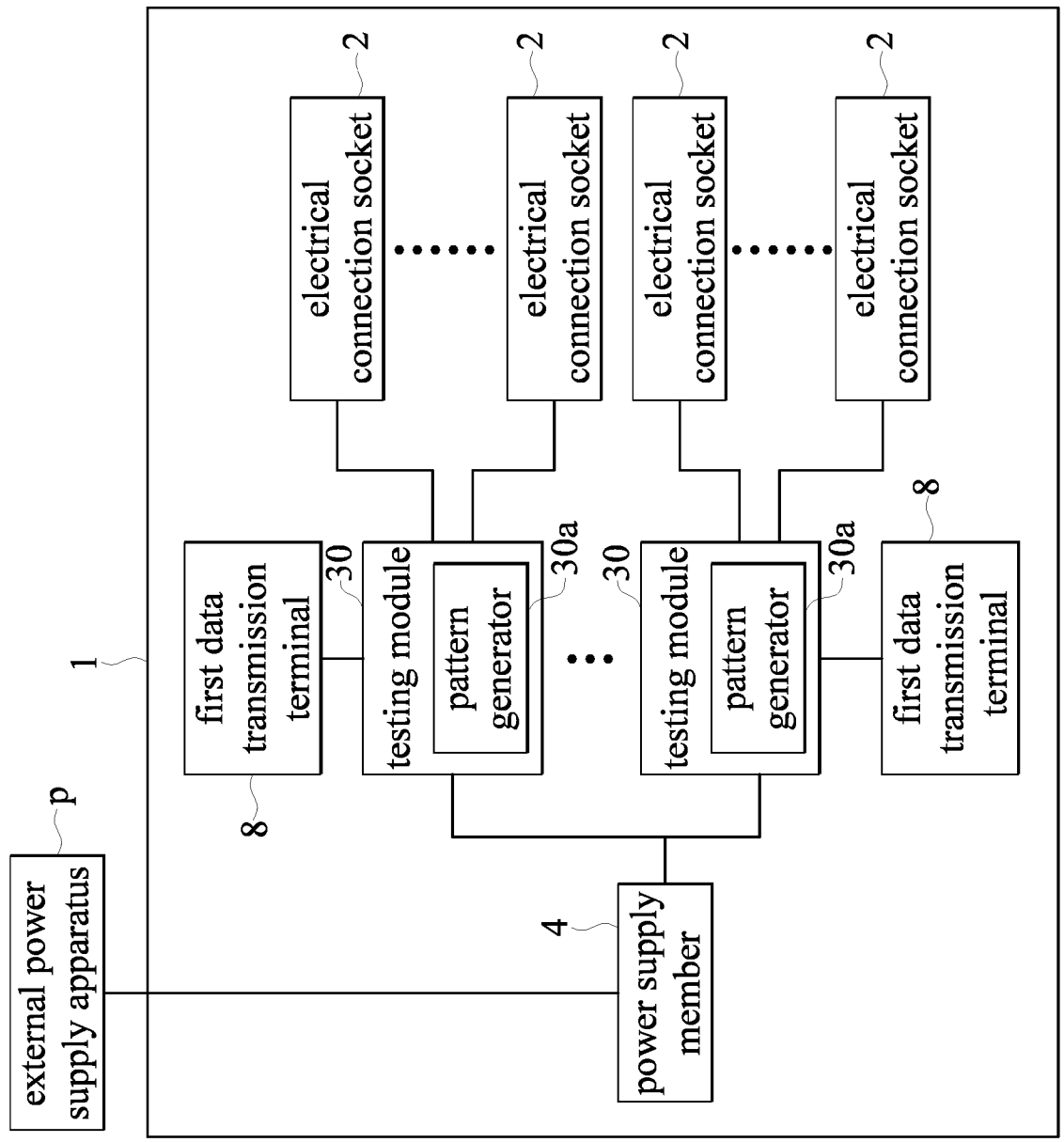
FIG. 10 is a functional block view of the chip testing device according to the present disclosure.
Figure 18:
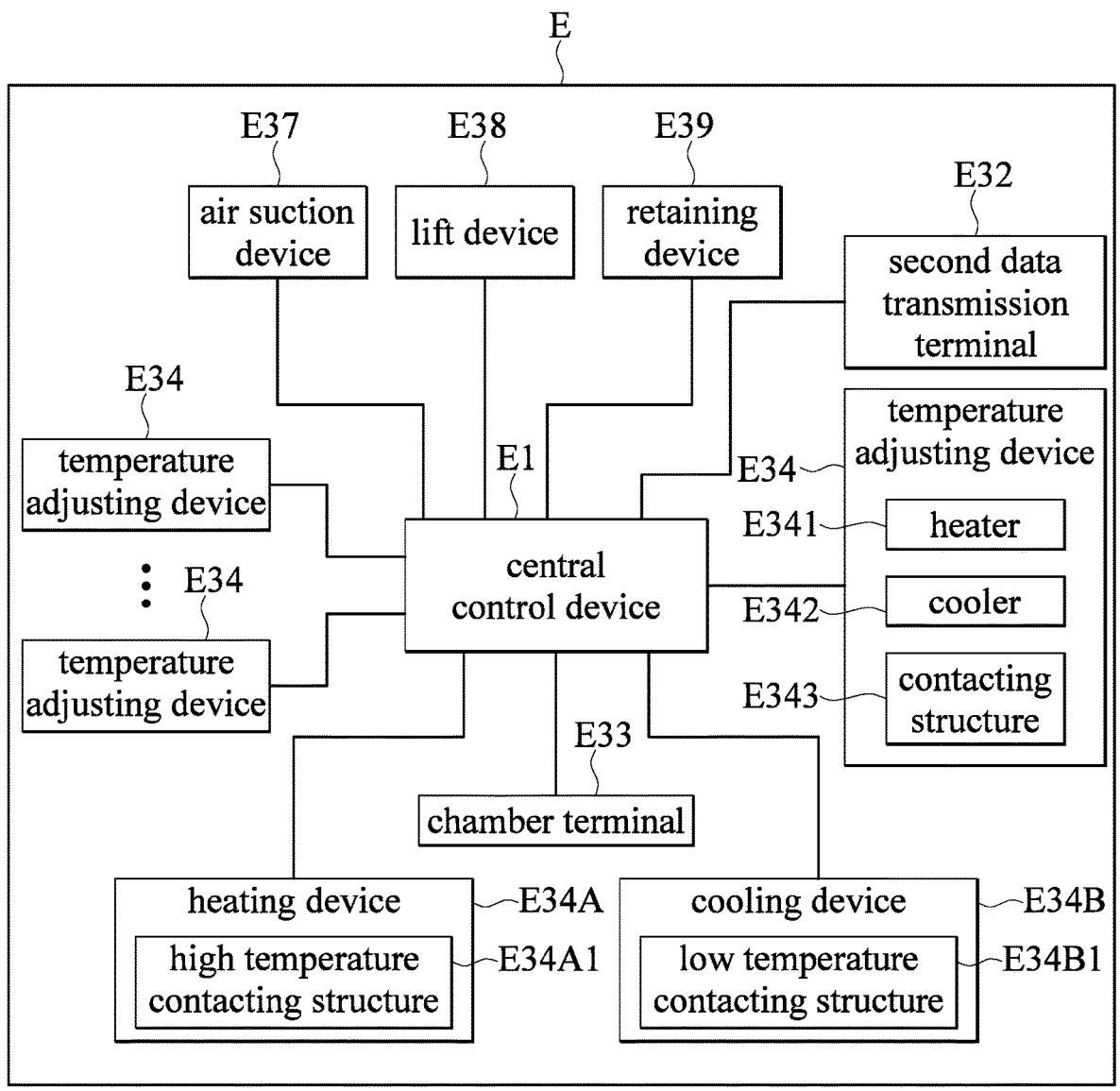
FIG. 18 is a functional block view of components included by the environment control apparatus and a central control device of the chip testing system according to the present disclosure.
Figure 19:
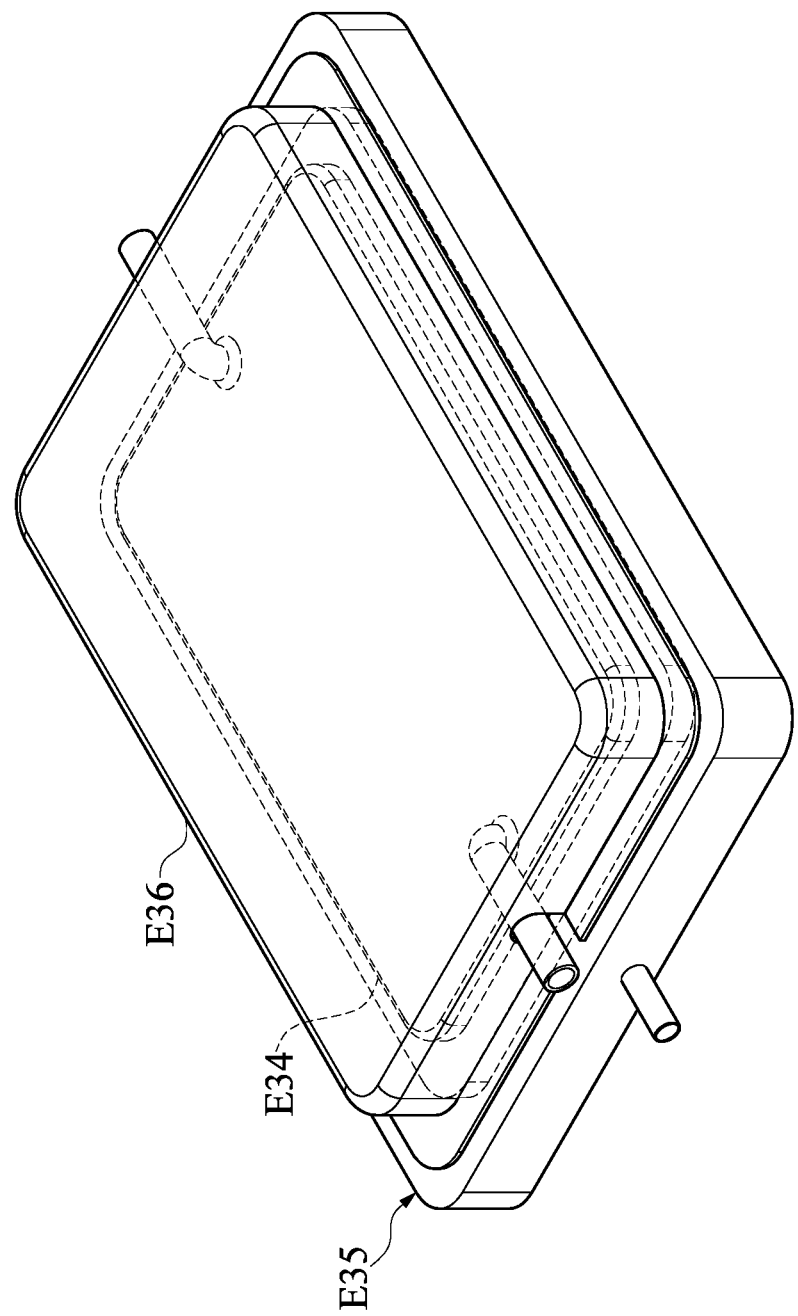
FIG. 19 is a schematic view of a temperature adjusting device and a cover of the chip testing system according to the present disclosure.

Referring to FIG. 10, FIG. 10 is a functional block view of the chip testing device according to the present disclosure. The power supply member 4 included by the chip testing device 1 can be connected to the testing modules 30, and each of the testing modules 30 is connected to the electrical connection sockets 2. The chip testing device 1 can include a plurality of first data transmission terminals 8, and each of the first data transmission terminals 8 can be connected to one of the testing modules 30. The first data transmission terminals 8 are configured to be connected to a plurality of second data transmission terminals E32 (as shown in FIG. 18) in a plurality of accommodating chambers E311 (as shown in FIG. 17 and is mentioned below) of an environment control apparatus E3 so that the chip testing device 1, the environment control apparatus E3, and a central control device E1 (as shown in FIG. 1) can mutually transmit data. In a practical application, each of the first data transmission terminals 8 and each of the second data transmission terminals E32 can be pogo pins or reeds, but the present disclosure is not limited thereto. The number and disposed position of the first data transmission terminals 8 and the second data transmission terminals E32 can be changed according to practical requirements, and the present disclosure is not limited thereto.

In other embodiments of the present disclosure, the chip testing device 1 can include at least one first data transmission antenna (not shown), and each of the accommodating chambers E311 can be provided with at least one second data transmission antenna (not shown). The first data transmission antenna and the second data transmission antenna are in cooperation with each other to mutually transmit data in a wireless manner. In a practical application, the first data transmission antenna can be not disposed in the accommodating chambers E311, and as long as the first data transmission antenna and the second data transmission antenna in the accommodating chamber E311 can mutually transmit data, the first data transmission antenna can be disposed at any position of the environment control apparatus E3.

Figure 11:
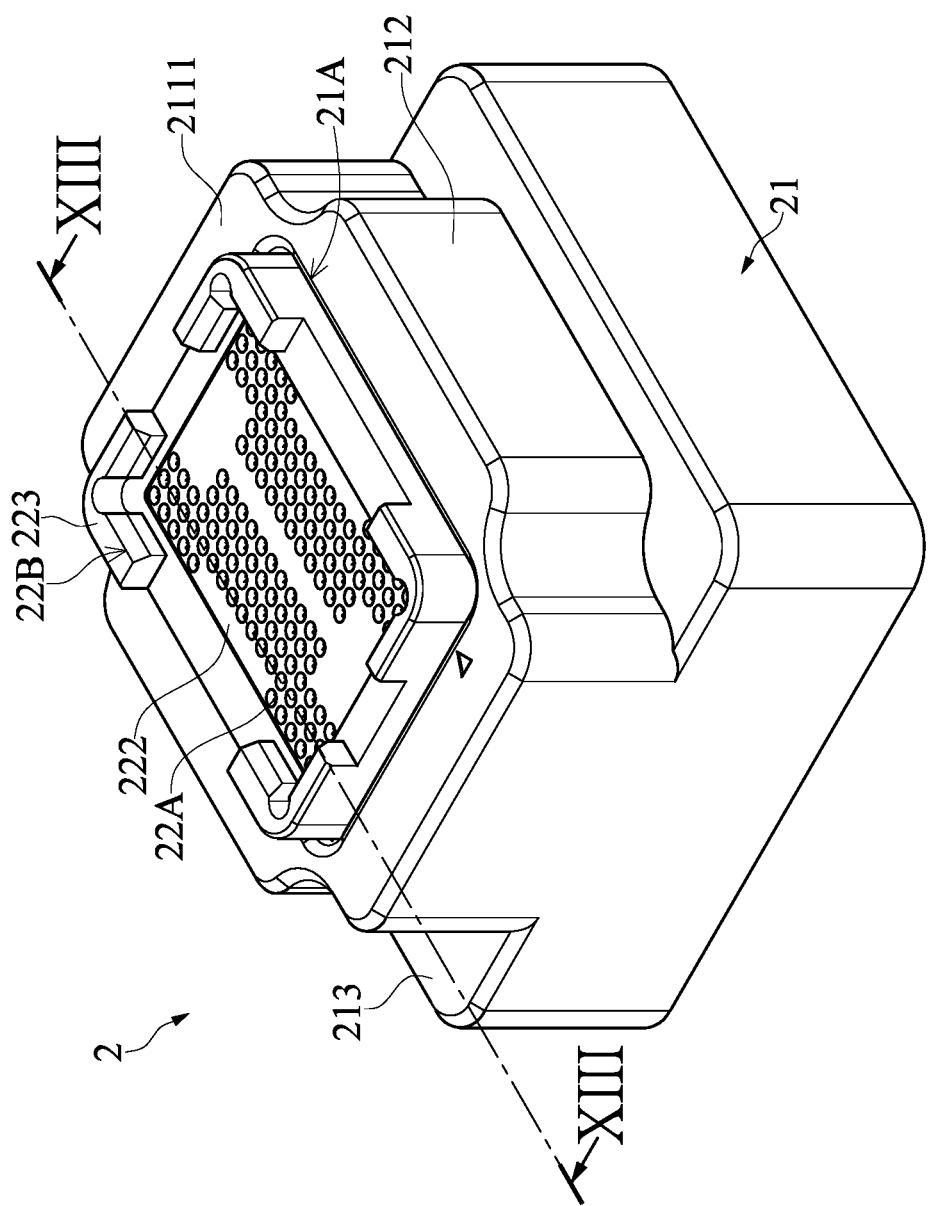
FIG. 11 is a schematic view of one of the electrical connection sockets of the chip testing device according to the present disclosure.
Figure 12:
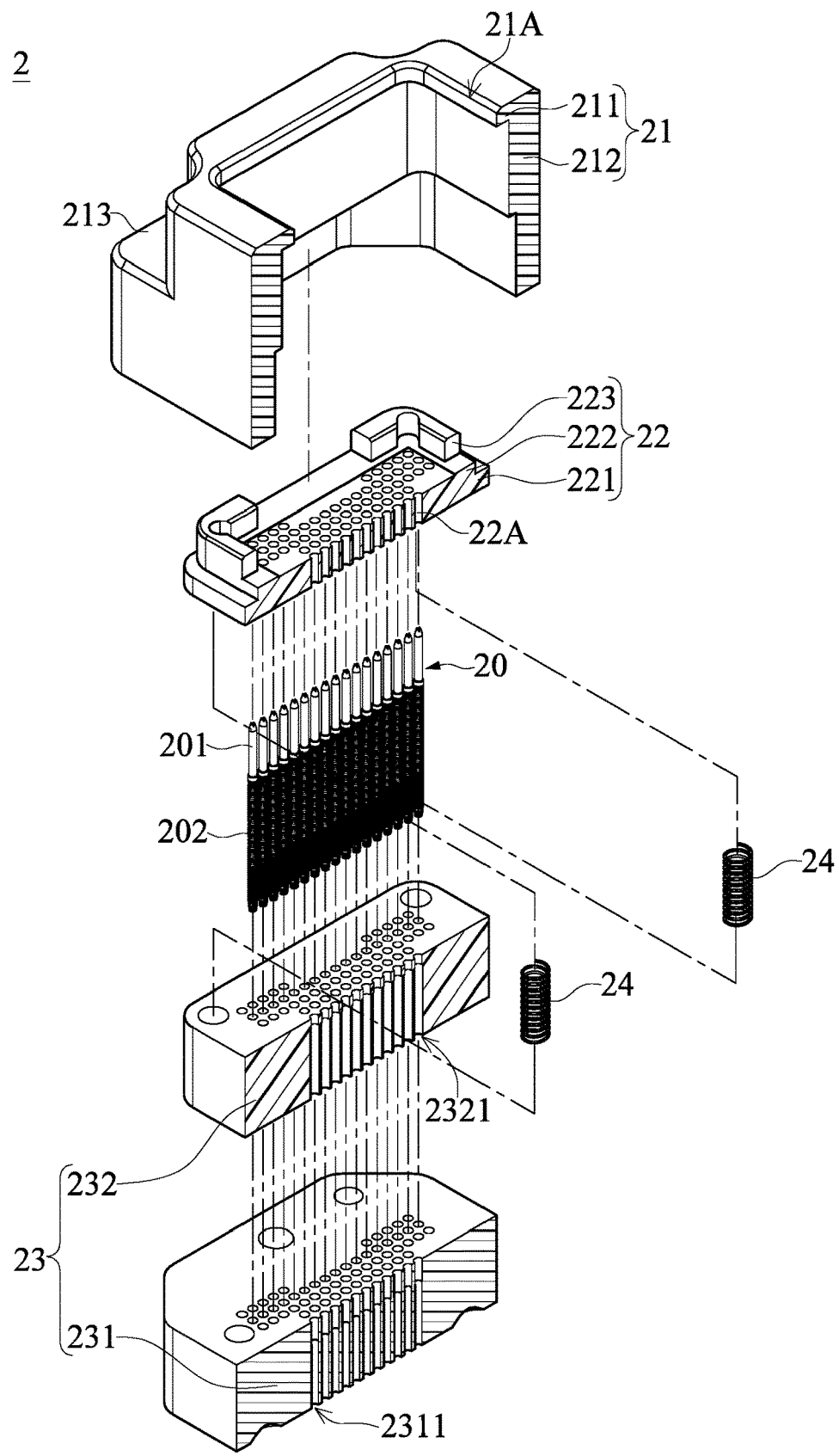
FIG. 12 is an exploded cross-sectional view of one of the electrical connection sockets of the chip testing device according to the present disclosure.
Figure 13:
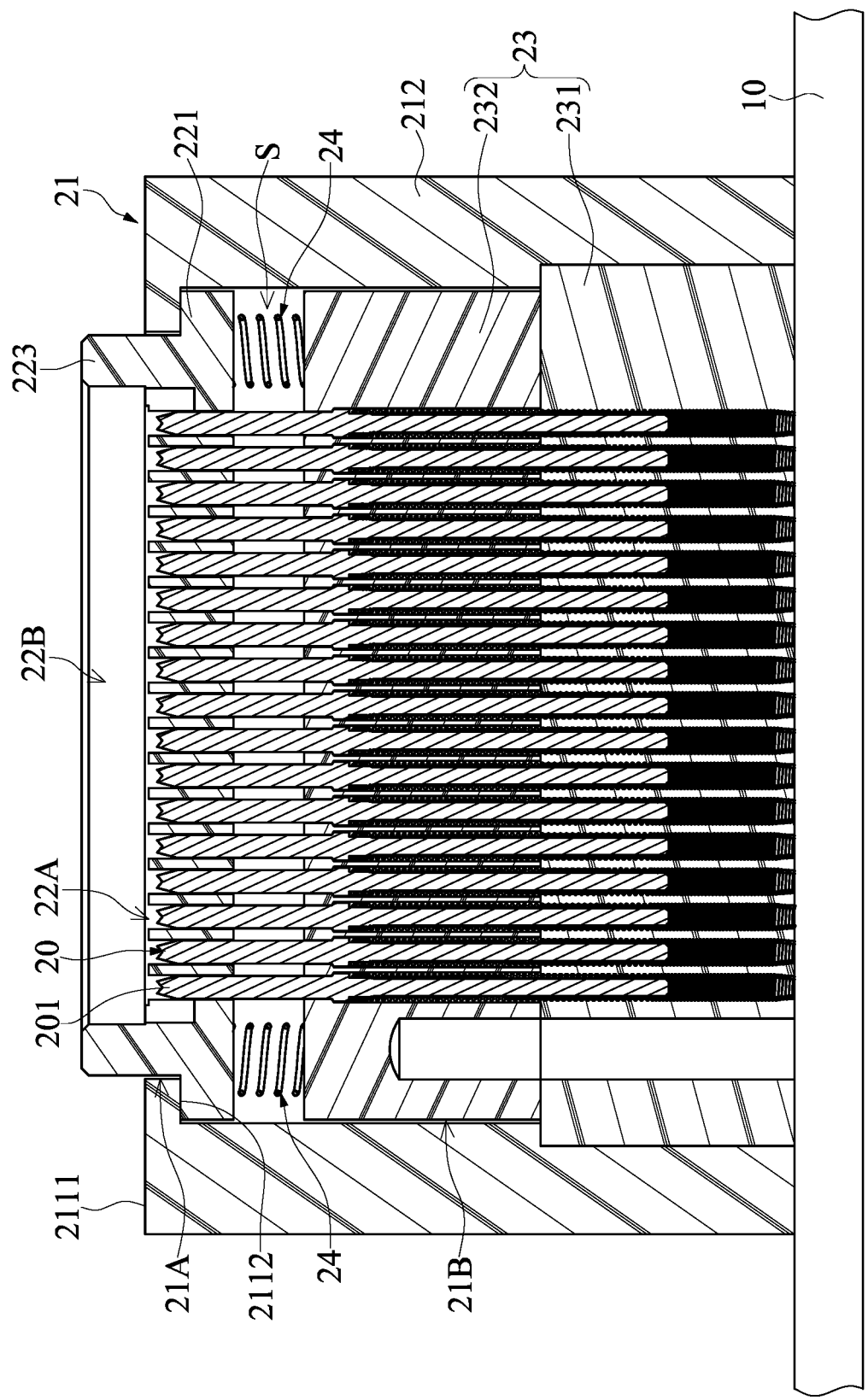
FIG. 13 is a cross-sectional view of one of the electrical connection sockets without a chip disposed thereon of the chip testing device according to the present disclosure.
Figure 14:
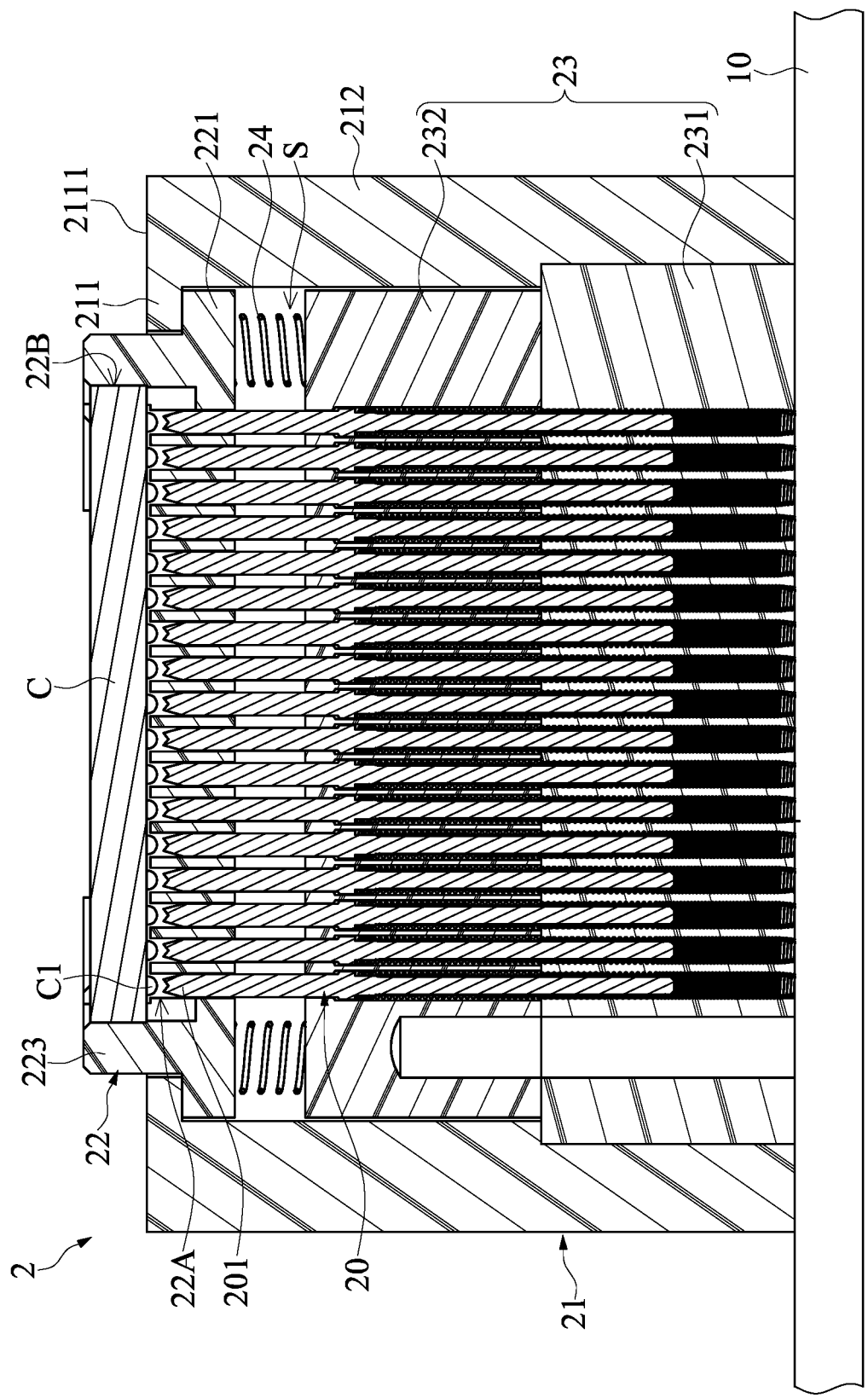
FIG. 14 is a cross-sectional view of one of the electrical connection sockets with a chip disposed thereon of the chip testing device according to the present disclosure.

Referring to FIG. 11 to FIG. 14, FIG. 11 is a schematic view of one of the electrical connection sockets of the chip testing device according to the present disclosure, FIG. 12 is an exploded cross-sectional view of one of the electrical connection sockets of the chip testing device according to the present disclosure, FIG. 13 is a cross-sectional view of one of the electrical connection sockets without a chip disposed thereon of the chip testing device according to the present disclosure, and FIG. 14 is a cross-sectional view of one of the electrical connection sockets with a chip disposed thereon of the chip testing device according to the present disclosure.

Each of the electrical connection sockets 2 includes a plurality of probe assemblies 20, a socket body 21, a lift structure 22, a supporting structure 23, and a plurality of elastic assemblies 24. Each of the probe assemblies 20 includes a pin 201 and a spring 202 that is sleeved around the pin 201. An end of the pin 201 is configured to be in contact with an electrical connection portion C1 of the chip C (shown in FIG. 14). The spring 202 is sleeved around the pin 201, and when an end of the pin 201 is pressed, the spring 202 is pressed and correspondingly generates an elastic returning force. Accordingly, when the pin 201 is no longer pressed, the spring 202 releases the elastic returning force to return the pin 201 to an initial position.

The socket body 21 has a top wall 211, an annular wall 212, and an abutting portion 213. The top wall 211 has an opening 21A. One end of the annular wall 212 is connected to a peripheral edge of the top wall 211, and the other end of the annular wall 212 is disposed and fixed on the circuit board 10. The top wall 211, the annular wall 212, and the circuit board 1 jointly define an accommodating slot 21B. The top wall 211 has an inner surface 2111 and an outer surface 2112 opposite to the inner surface 2111 (as shown in FIG. 13). In a practical application, the top wall 211 and the annular wall 212 can be integrally formed as a one-piece structure.

The abutting portion 212 extends from the annular wall 212. As shown in FIG. 6 and FIG. 7, when the pressing structures 1112 are fixed to the fixing bodies 1114, the pressing structures 1112 are abutted against the abutting portion 213 of each of the electrical connection sockets 2. That is to say, with each of the abutting portions 213, the pressing structures 1112 can be preferably abutted, and the structures of the abutting portions 213 can be designed according to the pressing structures 1112 and the thru-holes 1113.

The lift structure 22 includes a base portion 221 and a carrying portion 222. The base portion 221 is entirely arranged in the accommodating slot 21B. The carrying portion 222 is formed by extending from the base portion 221, and is partially arranged in the opening 21A. The lift structure 22 includes four retaining portions 223 extending from the carrying portion 222 along a direction away from the base portion 221. The four retaining portions 223 can be respectively formed on four corners of the carrying portion 222. The four retaining portions 223 and the carrying portion 222 jointly form a chip receiving slot 22B for accommodating one of the chips C. The four retaining portions 223 are configured to be engaged with the chip C. The lift structure 22 further has a plurality of connection holes 22A (as shown in FIG. 12) penetratingly formed through the base portion 221 and the carrying portion 222.

The probe assemblies 20 are partially fixed in the supporting structure 23, and first ends of the probe assemblies 20 are fixed to the supporting structure 23 so as to be connected to the electrical contacting structures 1011 (as shown in FIG. 8) of the circuit board 10. Second ends of the probe assemblies 20 are in one of the connection holes 22A so as to be connected to the electrical connection portion C1 of the chip C.

In a practical application, the supporting structure 23 can include a seat structure 231 and an auxiliary structure 232. The seat structure 231 is arranged in the accommodating slot 21B, and is fixed to the socket body 21 (e.g., the seat structure 231 and the socket body 21 are fixed to each other by screws). The seat structure 231 has a plurality of thru-holes 2311, and the first ends of the probe assemblies 20 are fixed in the thru-holes 2311 of the seat structure 231. The auxiliary structure 232 is arranged in the accommodating slot 21B and between the seat structure 231 and the top wall 211, and the auxiliary structure 232 and the seat structure 231 are fixed to each other (e.g., by screws). The auxiliary structure 232 has a plurality of supporting holes 2321 spaced apart from each other. The supporting holes 2321 are respectively in spatial communication with the thru-holes 2311 of the seat structure 231, and respectively correspond in position to the connection holes 22A. The connection holes 22A, the supporting holes 2321, and the thru-holes 2311 jointly define a plurality of probe channels, and the probe assemblies 20 are respectively arranged in the probe channels.

Referring to FIG. 8 and FIG. 12, it is worth mentioning that the seat structure 231 can include a plurality of positioning holes 2312, and each of the positioning holes 2312 can be penetrated by one of the positioning members 25. In a practical application, each of the positioning holes 2312 can penetrate through the seat structure 231, but the present disclosure is not limited thereto.

As shown in FIG. 13, the supporting structure 23 is arranged in the accommodating slot 21B, and the elastic assemblies 24 are disposed between the supporting structure 23 and the lift structure 22. The elastic assemblies 24 are configured to push the base portion 221 of the lift structure 22 to abut against the inner surface 2112 of the top wall 211, so that the base portion 221 and the supporting structure 23 have a gap S there-between.

In a practical application, when the electrical connection socket 2 is fixed to the circuit board 10 and the lift structure 22 is not pressed by an external force, the four elastic assemblies 24 between the lift structure 22 and the supporting structure 23 can be slightly compressed to generate an elastic returning force that pushes the lift structure 22 to firmly abut against the inner surface 2112 of the top wall 211.

As shown in FIG. 14, when the chip receiving slot 22B receives the corresponding chip C and the retaining portions 223 are not pressed, the electrical connection portions C2 of the chip C are respectively arranged in the connecting holes 22A, and the probe assemblies 20 are not connected to (e.g., do not touch) the electrical connection portions C2 of the chip C. When the lift structure 22 is pressed, at least part of the lift structure 22 is moved into the socket body 21. In other words, the lift structure 22 is moved toward the circuit board 1 relative to the supporting structure 23, and the probe assemblies 20 would be in contact with the electrical connection portions C1 (as shown in FIG. 14) of the chip C.

Figure 15:
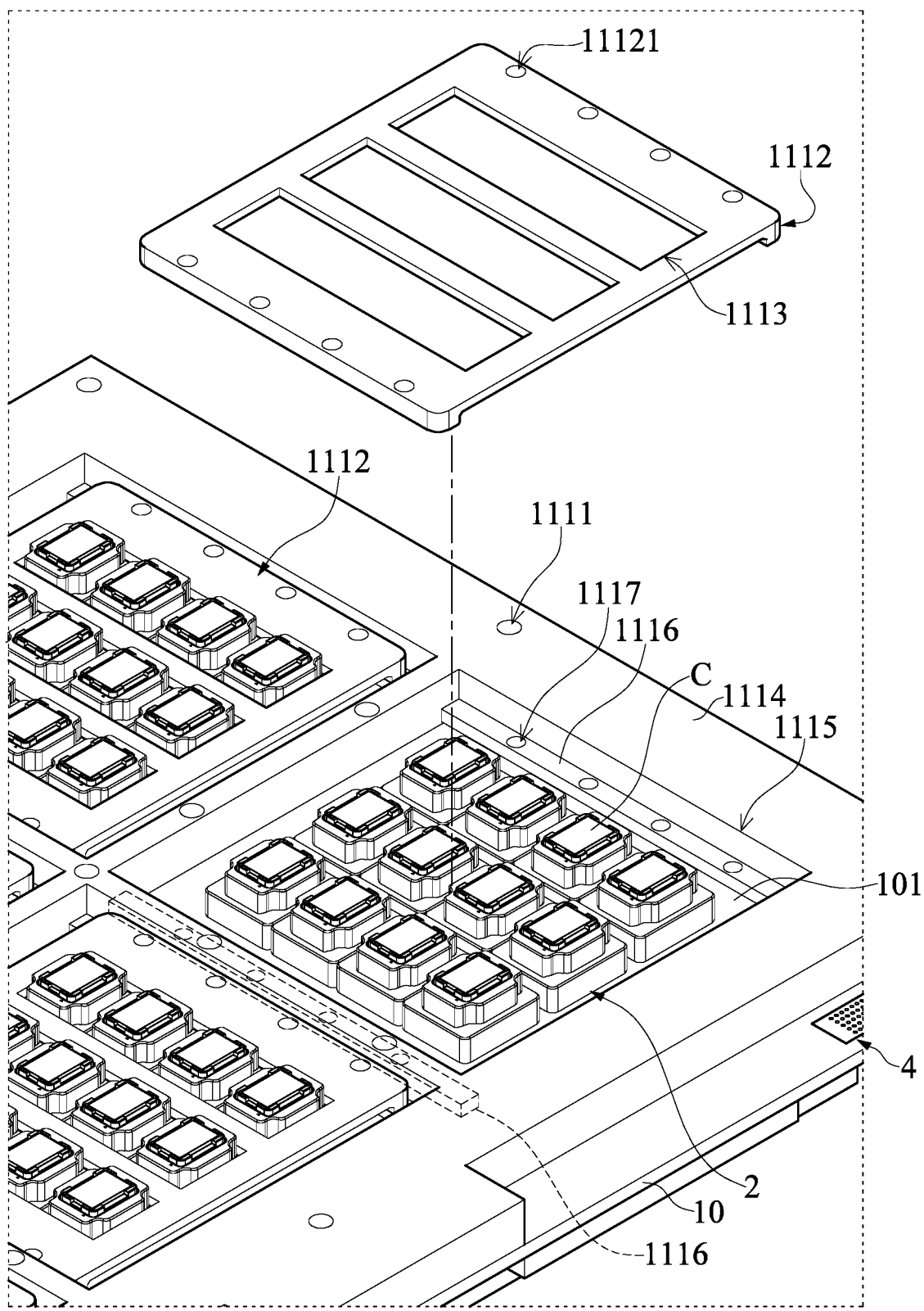
FIG. 15 is an exploded view of the pressing structures and the fixing body of the chip testing device according to another embodiment of the present disclosure.

Referring to FIG. 7, in the embodiment shown in FIG. 7, the number of the thru-holes 1113 of the pressing structures 1112 corresponds to the number of the electrical connection sockets 2 in the group accommodating holes 1115. When the pressing structures 1112 are disposed in the accommodating holes 1115, a part of each of the electrical connection sockets 2 correspondingly penetrates through thru-holes 1113 of the adjacent pressing structures 1112. Referring to FIG. 15, in other embodiments of the present disclosure, the number of the thru-holes 1113 of the pressing structures 1112 can be a number that does not completely correspond to the number of electrical connection sockets 2. For example, the number of the thru-holes 1113 of the pressing structures 1112 can be three, and when the pressing structures 1112 press on the electrical connection sockets 2 in the accommodating holes 1115, each of the thru-holes is penetrated by parts of the electrical connection sockets 2. In other words, the number or the structure of the pressing structures 1113 of the thru-holes 1112 can be changed according to practical requirements and is not limited to the number and the structure as shown in FIG. 7 or FIG. 15.

Figure 16:
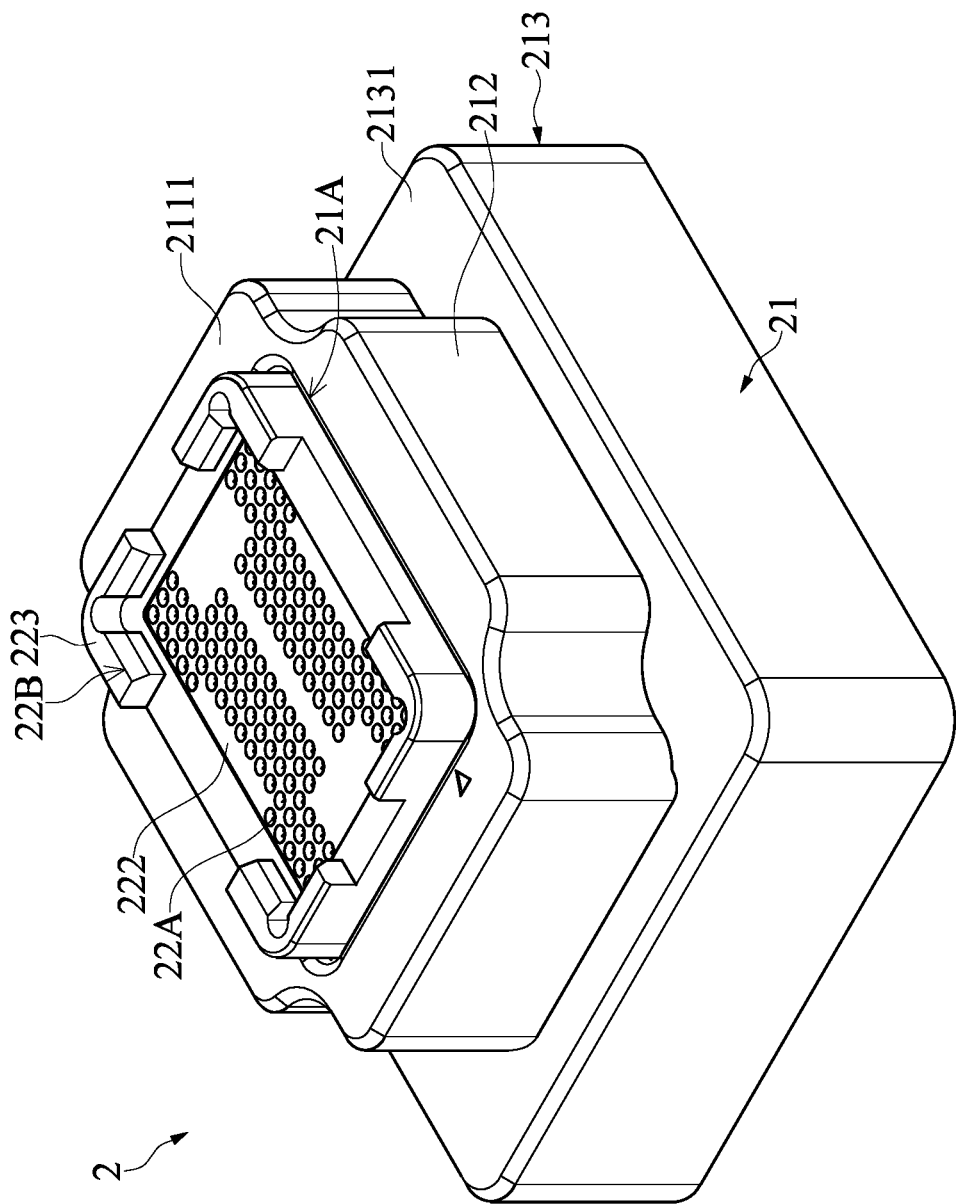
FIG. 16 is a schematic view of one of the electrical connection sockets of the chip testing device according to another embodiment of the present disclosure.

Referring to FIG. 15 and FIG. 16, when the pressing structures 1112 are in a form shown in FIG. 15, the structure of each of the electrical connection sockets 2 can be as of what shown in FIG. 16. The difference between the electrical connection sockets 2 shown in FIG. 16 and the electrical connection sockets 2 shown in FIG. 11 is that the abutting portion 213 of each of the electrical connection sockets 2 has an annular abutting surface 2131, and the annular wall 212 is correspondingly in a space surrounded by the annular abutting surface 2131. When pressing structures 1112 press on the electrical connection sockets 2 in the group accommodating holes 1115, the pressing structures 1112 correspondingly press on a part of the annular abutting surface 2131 of each of the electrical connection sockets 2.

Referring to FIG. 10, FIG. 17, and FIG. 18, FIG. 17 is a schematic view of an environment apparatus of the chip testing system according to the present disclosure, and FIG. 18 is a functional block view of components included by the environment control apparatus and a central control device of the chip testing system according to the present disclosure. The environment control apparatuses E3 are connected to the central control device E1, and the central control device E1 can control any one of the environment control apparatuses E3 to be independently operated. Each of the environment control apparatuses E3 can provide an environment having a predetermined temperature (e.g., a predetermined high temperature or a predetermined low temperature), and can perform the predetermined testing process on the chips C on the chip testing device E1 in the environment.

Each of the environment control apparatuses E3 includes an apparatus body E31. The apparatus body E31 includes a plurality of accommodating chambers E311. The accommodating chambers E311 are mainly configured to accommodate the chip testing device 1, the accommodating chambers E311 of each of the environment control apparatuses E3 can be or can be not in spatial communication with each other, and the present disclosure is not limited thereto.

In an embodiment of the present disclosure, the accommodating chambers E311 of one of the environment control apparatuses E3 are independent from each other and are not in a spatial communication with each other, each of the accommodating chambers E311 has a movable door, and the environment control apparatus E3 is connected to an air suction apparatus. When the chip testing device 1 is arranged in the accommodating chamber E311, the central control device E1 can control the corresponding movable door to move, and therefore resulting in the accommodating chamber E311 to be an enclosed space, and the central control device E1 can further control the air suction apparatus to be operated so that the accommodating chamber E311 is in a substantial vacuum state. Accordingly, an inner temperature of the accommodating chamber E311 is not easily affected by an external environment.

In an embodiment of the present disclosure, the power supply member 4 of the chip testing device 1 has the connection terminals, each of the accommodating chambers E311 can be provided with a plurality of chamber terminals E33 therein that are configured to be respectively connected to the connection terminals of the chip testing device 1. The position of the chamber terminals E33 is designed according to the position of the chip testing device 1 in the accommodating chamber E311 and the position of the connection terminals of the power supply member 4, but the present disclosure is not limited thereto. In an embodiment of the present disclosure, the power supply member 4 of the chip testing device 1 is the receiving antenna, each of the accommodating chambers E311 is provided with an emitting antenna therein that can be used to wirelessly charge and is connected to the external power supply apparatus P. When the chip testing device 1 is arranged in the accommodating chamber E311 at a predetermined position, the emitting antenna of the accommodating chamber E311 can be coupled with the receiving antenna (i.e., the power supply member 4) of the chip testing device 1, so that the external power supply apparatus P can provide electricity to each of the testing modules 30.

Each of the temperature adjusting devices E34 is connected to the central control device E1, and is controllable by the central control device E1 to adjust an environment temperature of the chips C on the electrical connection sockets 2 of the chip testing device 1 in the corresponding accommodating chamber E311 to be a predetermined temperature.

In an embodiment of the present disclosure, the temperature adjusting devices E34 can be divided into a plurality of heating devices E34A and a plurality of cooling devices E34B. The heating devices E34A and the cooling devices E34B are arranged in the apparatus body E31. The inner temperature of each of the accommodating chambers E311 can be changed by one of the heating devices E34A or one of the cooling devices E34B for reaching the predetermined high temperature or the predetermined low temperature. Each of the heating devices E34A has a high temperature contacting structure E34A1 that is configured to be in contact with one side of the chips C on the chip testing device 1. Each of the heating devices E34A is connected to the central control device E1. Each of the heating devices E34A is controllable by the central control device E1 to independently operate the high temperature contacting structure E34A1 and to increase a temperature of the high temperature contacting structure E34A1 to reach the predetermined high temperature. The material of the high temperature contacting structure E34A1 can be determined according to the predetermined high temperature. A side of the high temperature contacting structure E34A1 in contact with the one side of the chips C can be flat.

In a practical application, each of the high temperature contacting structures E34A1 can include an electric heater (e.g., a heating coil) or a plurality of fluid channels that provide a high temperature fluid to flow there-through. Moreover, the electric heater or a heater having the fluid channels can be disposed at one side of the high temperature contacting structure E34A1.

Each of the cooling devices E34B has a low temperature contacting structure E34B1 that is configured to be in contact with one side of the chips C on the chip testing device 1. Each of the cooling devices E34B is connected to the central control device E1. Each of the cooling devices E34B is controllable by the central control device E1 to independently operate the low temperature contacting structure E34B1 and to decrease a temperature of the low temperature contacting structure E34B1 to reach the predetermined low temperature. The material of the low temperature contacting structure E34B1 can be determined according to the predetermined high temperature. A side of the low temperature contacting structure E34B1 in contact with the one side of the chips C can be flat. In a practical application, each of the low temperature contacting structures E34B1 can include a plurality of fluid channels that provide a low temperature fluid to flow there-through. Moreover, a component having the fluid channels can be disposed on one side of the low temperature contacting structure E34B 1.

In the above embodiment, each of the heating devices E34A has the high temperature contacting structure E34A1, and each of the cooling devices E34B has the low temperature contacting structure E34B1. Moreover, the heating device E34A and the cooling device E34B are configured to transmit or absorb heat to each of the chips C by using the high temperature contacting structure E34A1 and low temperature contacting structure E34B1 to be directly in contact with the one side of the chips C, so that the chips C can have the predetermined temperature. However, in other embodiments of the present disclosure, each of the heating devices E34A and each of the cooling devices E34B can allow the environment temperature of the chips C to reach the predetermined temperature without contacting the chips C. For example, each of the heating devices E34A or each of the cooling devices E34B can be provided to directly increase or decrease the inner temperature of the corresponding accommodating chamber E311.

In the above description, each of the accommodating chambers E311 can be provided with the heating device E34A or the cooling device E34B therein, but each of the temperature adjusting devices E34 in the corresponding accommodating chamber E311 is not limited to only have a heating function or a cooling function. In other embodiments of the present disclosure, each of the temperature adjusting devices E34 can include a heater E341 and a cooler E342, and can further include a contacting structure E343 according to design requirements. The heater E341 and the cooler E342 are controllable by the central control device E1 so that a temperature of the contacting structure E343 is at the predetermined high temperature or the predetermined low temperature. The contacting structure E343 is configured to contact the chips C on the chip testing device 1, so that the chips C can reach the predetermined temperature by being directly contacted with the contacting structure E343. In other embodiments of the present disclosure, each of the temperature adjusting devices E34 can be provided without the contacting structure E343, which allows the corresponding accommodating chamber E311 to have the predetermined high temperature or the predetermined low temperature through the heater E341 or the cooler E342.

Figure 20:
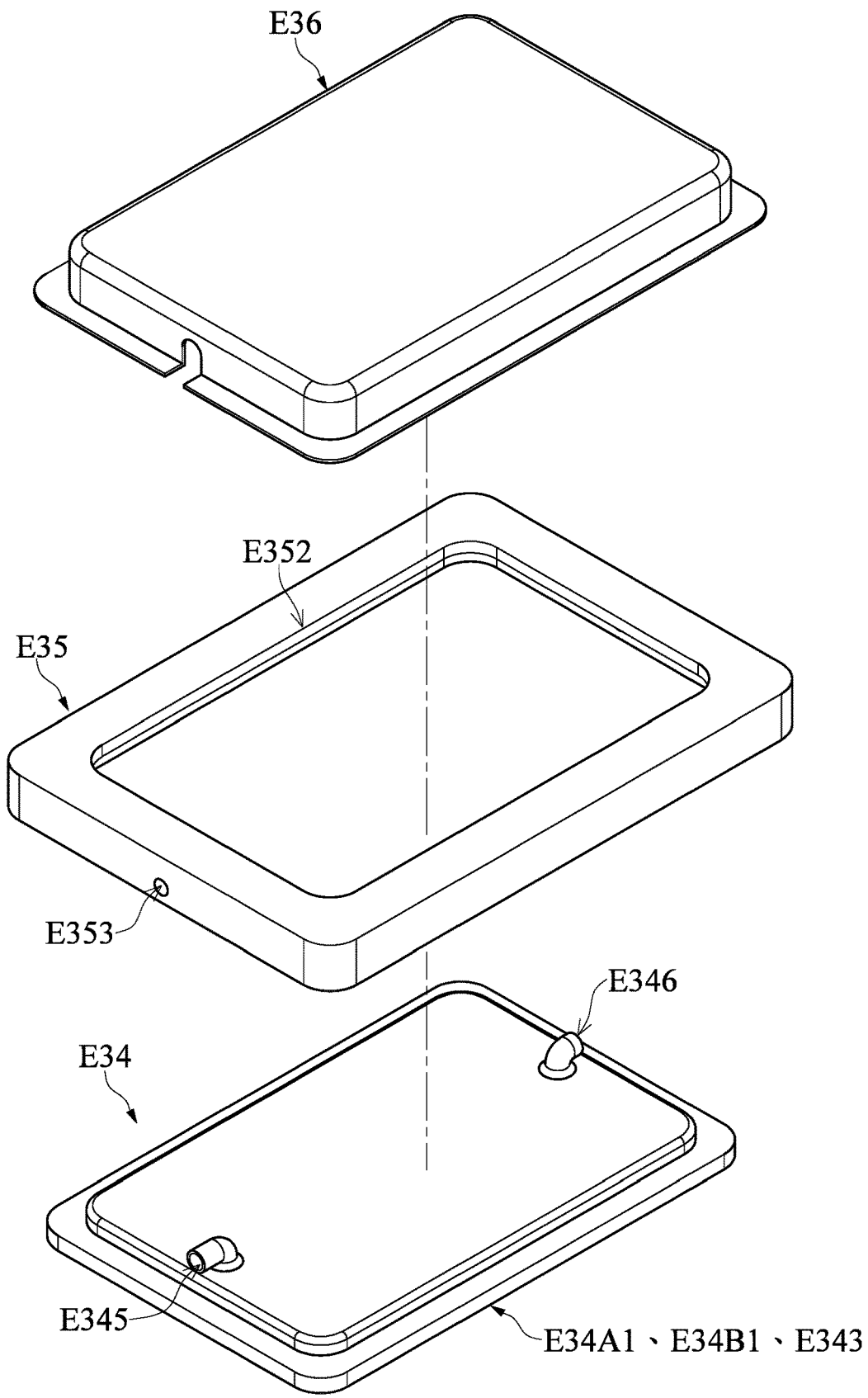
FIG. 20 and FIG. 21 are exploded views of the temperature adjusting device and the cover of the chip testing system according to the present disclosure.
Figure 21:
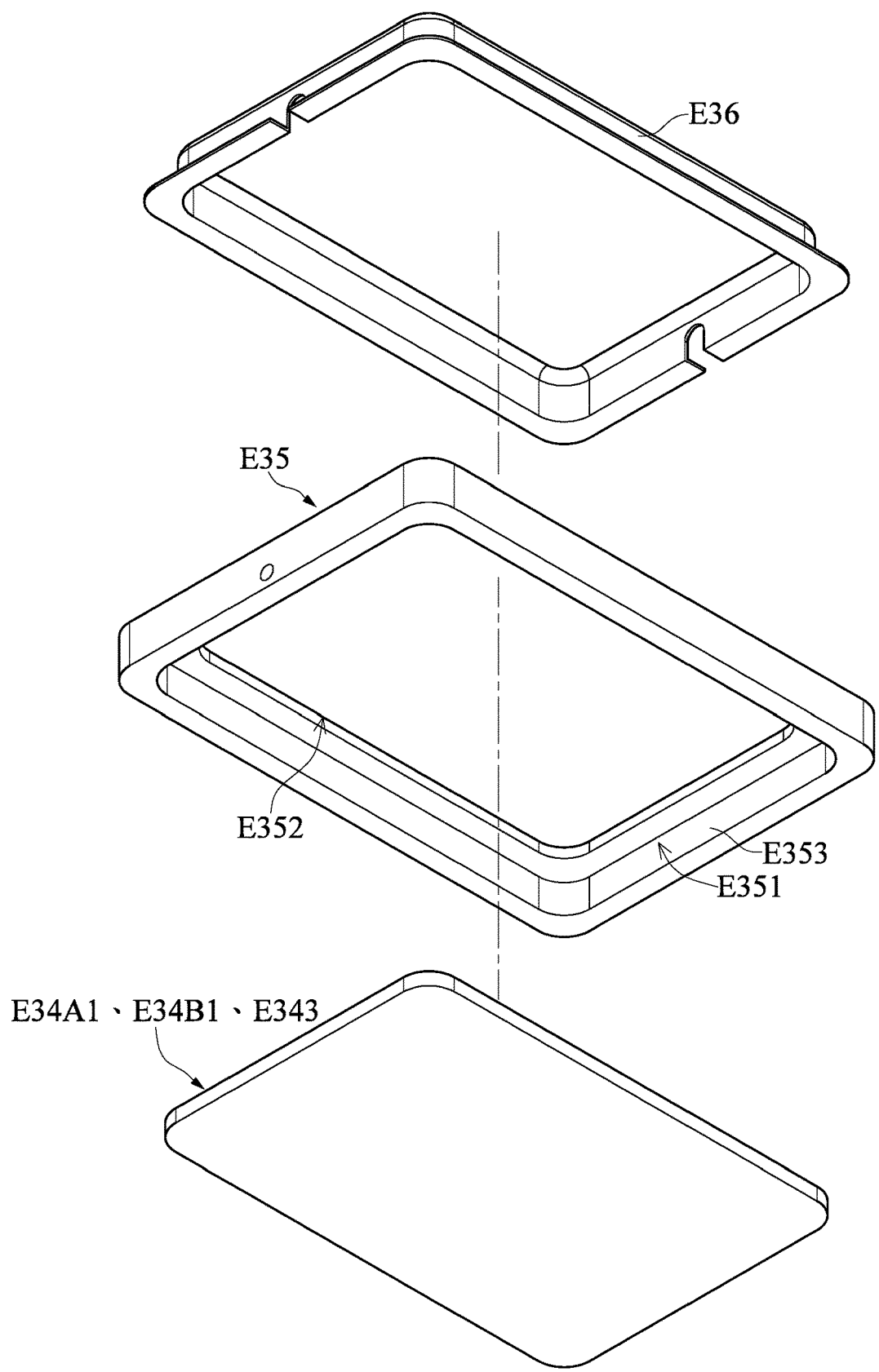
Figure 22:
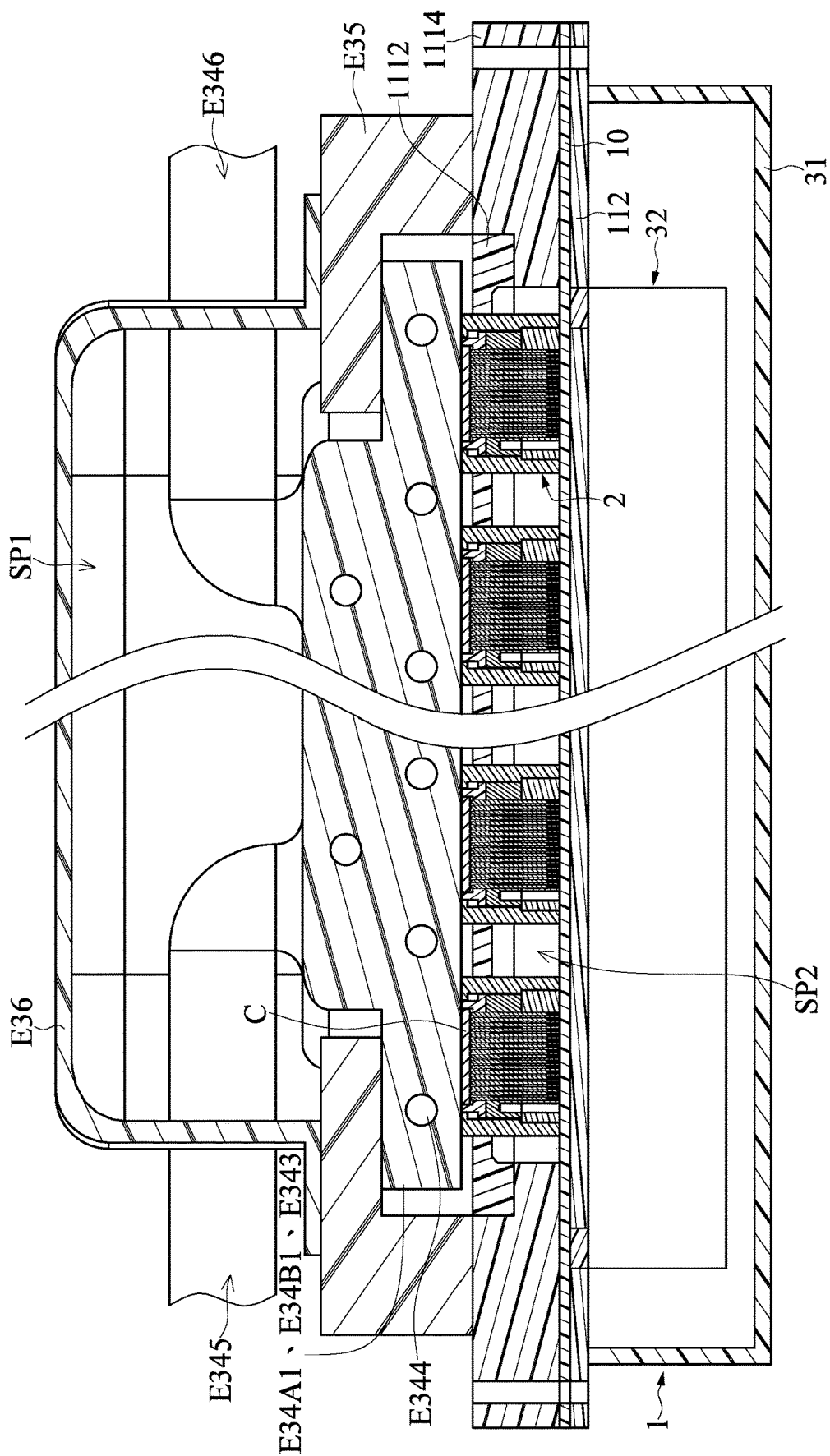
FIG. 22 is a cross-sectional view of the temperature adjusting device and the cover of the chip testing system and disposed on the chip testing device according to the present disclosure.
Figure 23:
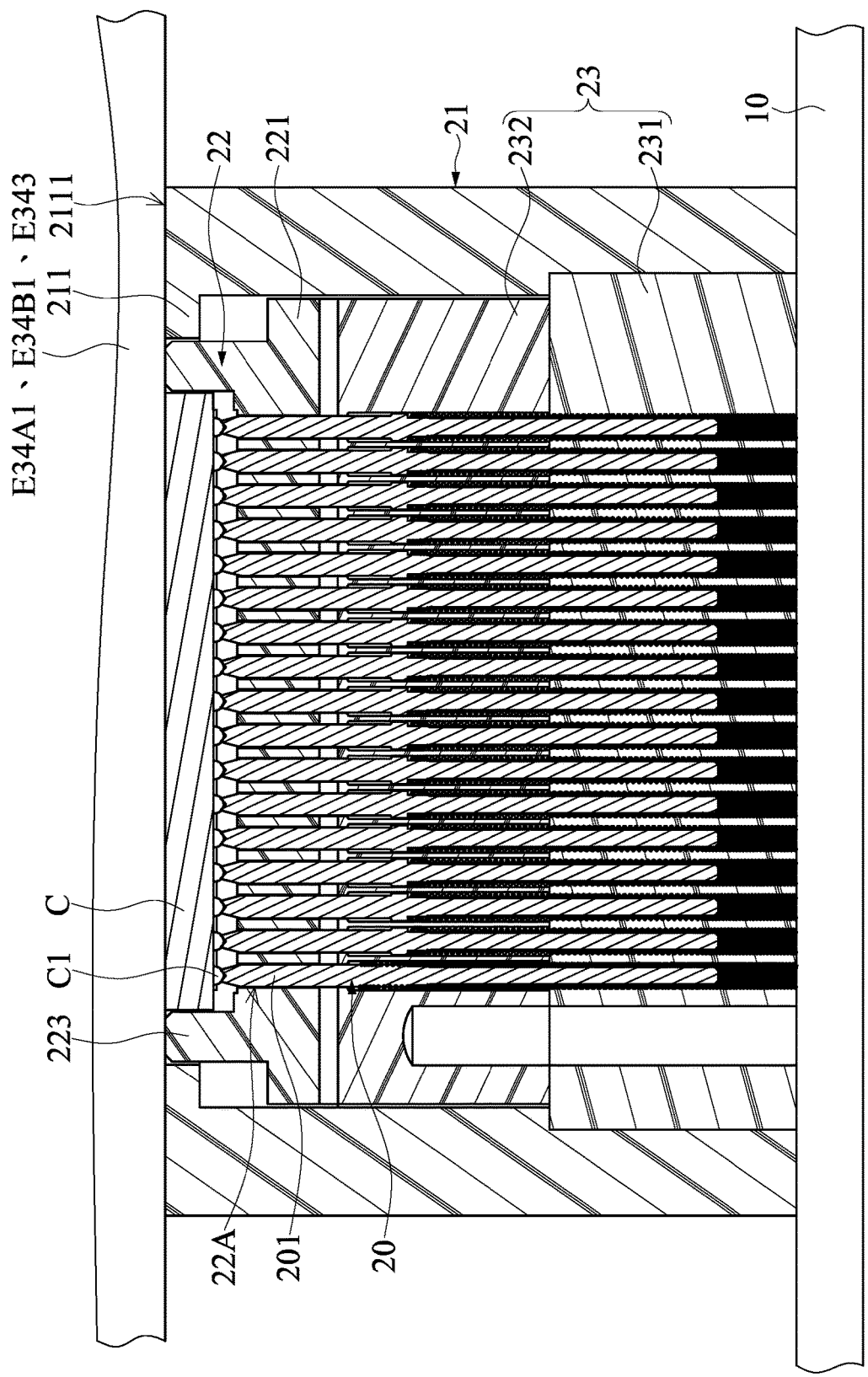
FIG. 23 is a partial enlarged view of the temperature adjusting device and the cover disposed on the chip testing device of the chip testing system according to the present disclosure.

Referring to FIG. 13, FIG. 18 to FIG. 23, FIG. 19 is a schematic view of a temperature adjusting device and a cover of the chip testing system according to the present disclosure, FIG. 20 and FIG. 21 are exploded views of the temperature adjusting device and the cover of the chip testing system according to the present disclosure, FIG. 22 is a cross-sectional view of the temperature adjusting device and the cover of the chip testing system and disposed on the chip testing device according to the present disclosure, and FIG. 23 is a partial enlarged view of the temperature adjusting device and the cover disposed on the chip testing device of the chip testing system according to the present disclosure. The temperature adjusting device E34 of each of the environment control apparatuses E3 can be connected to a cover E35. The cover E35 has a concavity E351 formed on one side thereof. The cover E35 has an accommodating opening E352 in spatial communication with the concavity E351. The cover E35 further has two air suction holes E353. Each of the environment control apparatuses E3 can include at least one air suction device E37, and the two air suction holes E353 are configured to be connected to the air suction device E37.

The temperature adjusting device E34 can include the high temperature contacting structure E34A1, low temperature contacting structure E34B1, or the contacting structure E343, and one side of the high temperature contacting structure E34A1, low temperature contacting structure E34B1, or the contacting structure E343 can be flat. The high temperature contacting structure E34A1, low temperature contacting structure E34B1, or the contacting structure E343 can include at least one fluid channel E344, a fluid entrance E345, and a fluid exit E346, the latter two of which correspond in position to the fluid channel E344. A high temperature fluid or a low temperature fluid can flow into the fluid channel E344 through the fluid entrance E345, and can flow out of the fluid channel E344 through the fluid exit E346. Since the high temperature fluid or the low temperature fluid continuously flows in the fluid channel E344, the temperature of the high temperature contacting structure E34A1, low temperature contacting structure E34B1, or the contacting structure E343 can reach the predetermined temperature.

In a practical application, the cover E35 can be fixed to a lid E36, and the lid E36 and the temperature adjusting device E34 jointly define an accommodating space SP1 therebetween that can be filled with any component having heat-insulation property.

Referring to FIG. 22 and FIG. 23, FIG. 22 shows the electrical connection sockets 2 of the chip testing device 1, the chip C disposed thereon, the high temperature contacting structure E34A1, the low temperature contacting structure E34B1, and the contacting structure E343 contacting with each other, and FIG. 23 is a partial enlarged view of FIG. 22. When the cover E35 is abutted against one side of the first fixing member 111, the cover E35, the high temperature contacting structure E34A1, the low temperature contacting structure E34B1, or the contacting structure E343, and the circuit board 10 jointly define an enclosed space SP2, the electrical connection sockets 2 are arranged in the enclosed space SP2, and the connection terminals of the power supply member 4 can be in contact with the corresponding chamber terminals E33.

As shown in FIG. 14 and FIG. 23, when the central control device E1 controls the air suction apparatus to suction away air in the enclosed space SP2 through the air suction holes E353 of the cover E35 so that the enclosed space SP2 is in a substantial vacuum state, the high temperature contacting structure E34A1, the low temperature contacting structure E34B1, or the contacting structure E343 would be abutted against the lift structure 22 of each of the electrical connection sockets 2, each of the lift structures 22 is moved toward the circuit board 10 relative to the corresponding socket body 21, the probe assemblies 20 are in contact with the electrical connection portions C1 of the corresponding chip C, and the high temperature contacting structure E34A1, the low temperature contacting structure E34B1, or contacting structure E343 is correspondingly abutted against the one side of the chips C. In other words, when the air of the enclosed space SP2 is expelled, the high temperature contacting structure E34A1, the low temperature contacting structure E34B1, or contacting structure E343 would be abutted against the lift structure 22 of each of the electrical connection sockets 2, and the lift structure 22 of each of the electrical connection sockets 2 is moved from a position shown in FIG. 14 to a position shown in FIG. 23.

In a practical application, the central control device E1 can control the air suction apparatus to suction away the air of the enclosed space SP2 at a predetermined condition that is determined according to design requirements. For example, the condition can be one of the following conditions. The connection terminals of the power supply member 4 and the chamber terminals E33 (as shown in FIG. 18) are connected to each other. The chip testing device 1 disposed in the accommodating chamber E311 (as shown in FIG. 17) at the predetermined position is detected by at least one sensor (e.g., an optical sensor or a mechanical compression sensor) that is arranged in the accommodating chamber E311.

Referring to FIG. 18 and FIG. 23, when the air of the enclosed space SP2 is expelled by the air suction device E37, the high temperature contacting structure E34A1, the low temperature contacting structure E34B1, or contacting structure E343 is abutted against the one side of the chips C, and the probe assemblies 20 of each of the electrical connection sockets 2 are connected to the electrical connection portions C1 of the corresponding chip C, the central control device E1 can control the temperature adjusting device E34 to be operated, so that the high temperature contacting structure E34A1, the low temperature contacting structure E34B1, or contacting structure E343 can have the predetermined temperature. Specifically, when the high temperature contacting structure E34A1, the low temperature contacting structure E34B1, or contacting structure E343 has the predetermined temperature, the central control device E1 can control the testing modules 30 connected to the electrical connection sockets 2 to perform the predetermined testing process on the chips C.

The cooperation of the cover E35 and the air suction device E37 can effectively reduce a force to cause the high temperature contacting structure E34A1, the low temperature contacting structure E34B1, or contacting structure E343 to be abutted against the lift structures 22 of the electrical connection sockets 2. In other words, cooperation of the cover E35 and the air suction device E37 can effectively reduce a force for causing the chips C of the chip testing device 1 to be abutted against the high temperature contacting structure E34A1, low temperature contacting structure E34B1, or the contacting structure E343 by a lift device E38 (as mentioned below).

It is worth mentioning that in the above description about the chip testing device 1, in the circuit board 10 of the chip testing device 1, only the circuit board screwing holes 103 penetrate through the circuit board 10. Therefore, when the cover E35 is abutted against the first fixing member 111, a tightness of the enclosed space SP2 can be easily controlled. When the air of the enclosed space SP2 is expelled by the air suction device E37, the enclosed space SP2 can be relatively more easily in a substantial vacuum state. That is to say, through the design of the first fixing member 111 and the second fixing member 112, the number of the thru-holes of the circuit board 10 can be effectively decreased so that when the air of the enclosed space SP2 is expelled by the air suction device E37, the enclosed space SP2 can easily be in a substantial vacuum state.

As shown in FIG. 1 and FIG. 2, the transferring apparatus E4 is disposed among the environment control apparatuses E3, and is configured to transfer the chip testing device 1. The transferring apparatus E4 can include a robotic arm and a retaining assembly that is configured to retain the chip testing device 1. The central control device E1 is connected to the transferring apparatus E4, and can control the transferring apparatus E4 to transfer the chip testing device 1 carrying the chips C into any one of the accommodating chambers E311 (shown in FIG. 17) of any one of the environment control apparatuses E3. Moreover, the transferring apparatus E4 is controllable by the central control device E1 to transfer the chip testing device 1 out of the corresponding accommodating chamber E311.

The classification apparatus E5 is connected to the central control device E1, and is controllable by the central control device E1 to detach the chips C from the electrical connection sockets 2 of the chip testing device 1. Moreover, the classification apparatus E5 can place the chips C at a good product region A1 of a tray or a defective product region A2 of a tray according to test results of the chips C from the predetermined testing process. The classification apparatus E5 can include a robotic arm. In an embodiment of the present disclosure, the classification apparatus E5 and the chip mounting apparatus E2 are arranged adjacent to each other, and are configured to share the same robotic arm. In a practical application, the good product region A1 can be divided into a plurality of sub-regions according to design requirements, and the classification apparatus E5 can place the chips C at different sub-regions of the good product region A1 according to the test results of the chips C from the predetermined testing process. For example, the chips C can be classified according to the working performance thereof.

Figure 24:
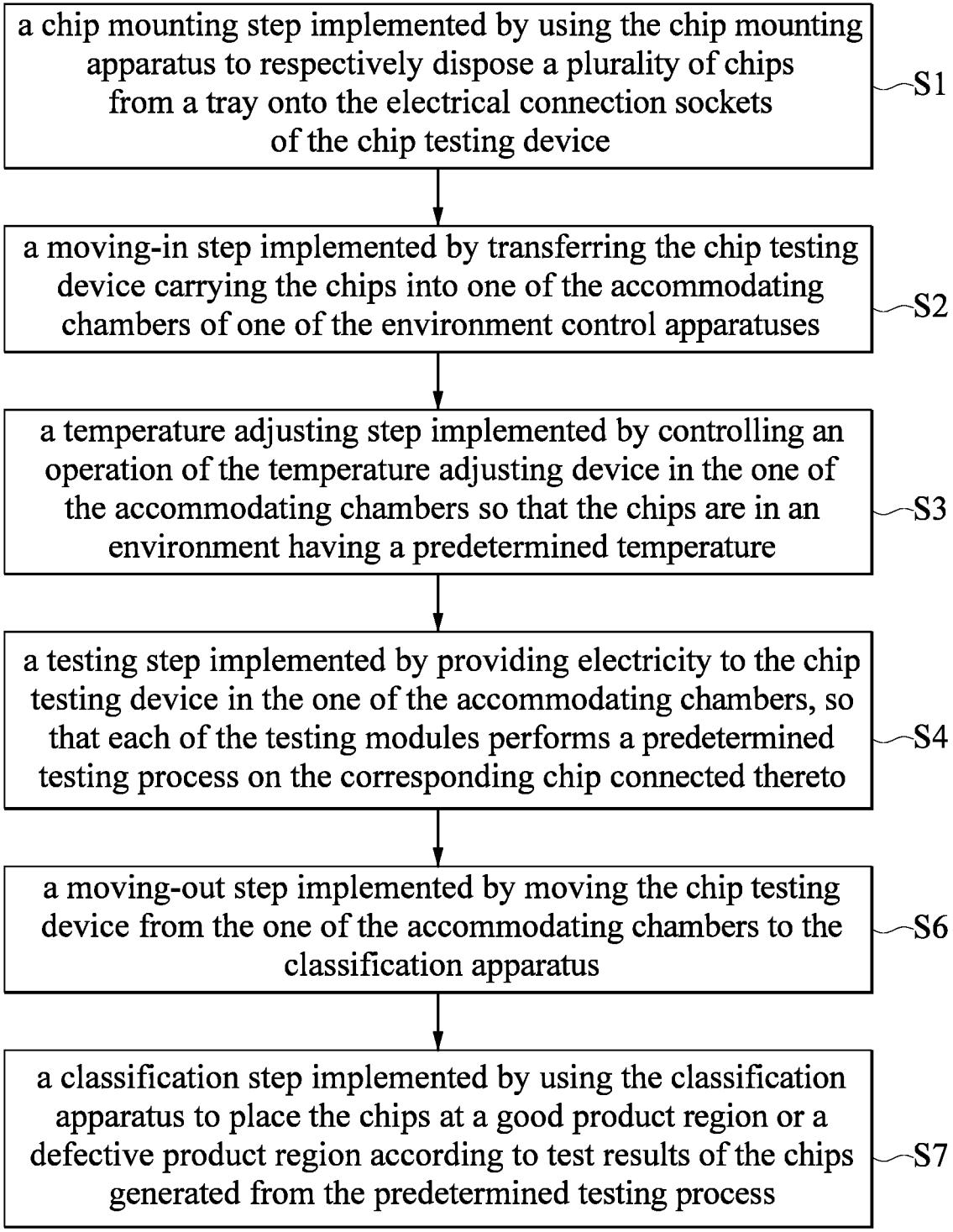
FIG. 24 is a flow chart showing a chip testing method that is implemented by using the chip testing system according to a first embodiment of the present disclosure.

Referring to FIG. 24, FIG. 24 is a flow chart showing a chip testing method that is implemented by using the chip testing system according to a first embodiment of the present disclosure. The chip testing system E can perform the predetermined testing process on the chips C by implementing the following chip testing method. The chip testing method includes: a chip mounting step S1 implemented by using the chip mounting apparatus E2 to respectively dispose a plurality of chips C from a tray onto the electrical connection sockets 2 of the chip testing device 1; a moving-in step S2 implemented by transferring the chip testing device 1 carrying the chips C into one of the accommodating chambers E311 of one of the environment control apparatuses E3; a temperature adjusting step S3 implemented by controlling an operation of the temperature adjusting device E34 in the one of the accommodating chambers E311 so that the chips C are in an environment having a predetermined temperature; a testing step S4 implemented by providing electricity to the chip testing device 1 in the one of the accommodating chambers E311, so that each of the testing modules 30 performs a predetermined testing process on the corresponding chip C connected thereto; a moving-out step S6 implemented by moving the chip testing device 1 from the one of the accommodating chambers E311 to the classification apparatus E5; and a classification step S7 implemented by using the classification apparatus E5 to place the chips C at a good product region A1 or a defective product region A2 according to test results of the chips C generated from the predetermined testing process.

In an embodiment of the present disclosure, the power supply member 4 of the chip testing device 1 includes the connection terminals, and the chip testing method further includes a connecting step before the testing step S4. Moreover, the connecting step is implemented by connecting the connection terminals of the power supply member 4 of the chip testing device 1 to the chamber terminals E33 of the one of the accommodating chambers E311. Specifically, the connecting step can be implemented between the moving-in step S2 and the temperature adjusting step S3, or between the temperature adjusting step S3 and the testing step S4.

Figure 25:
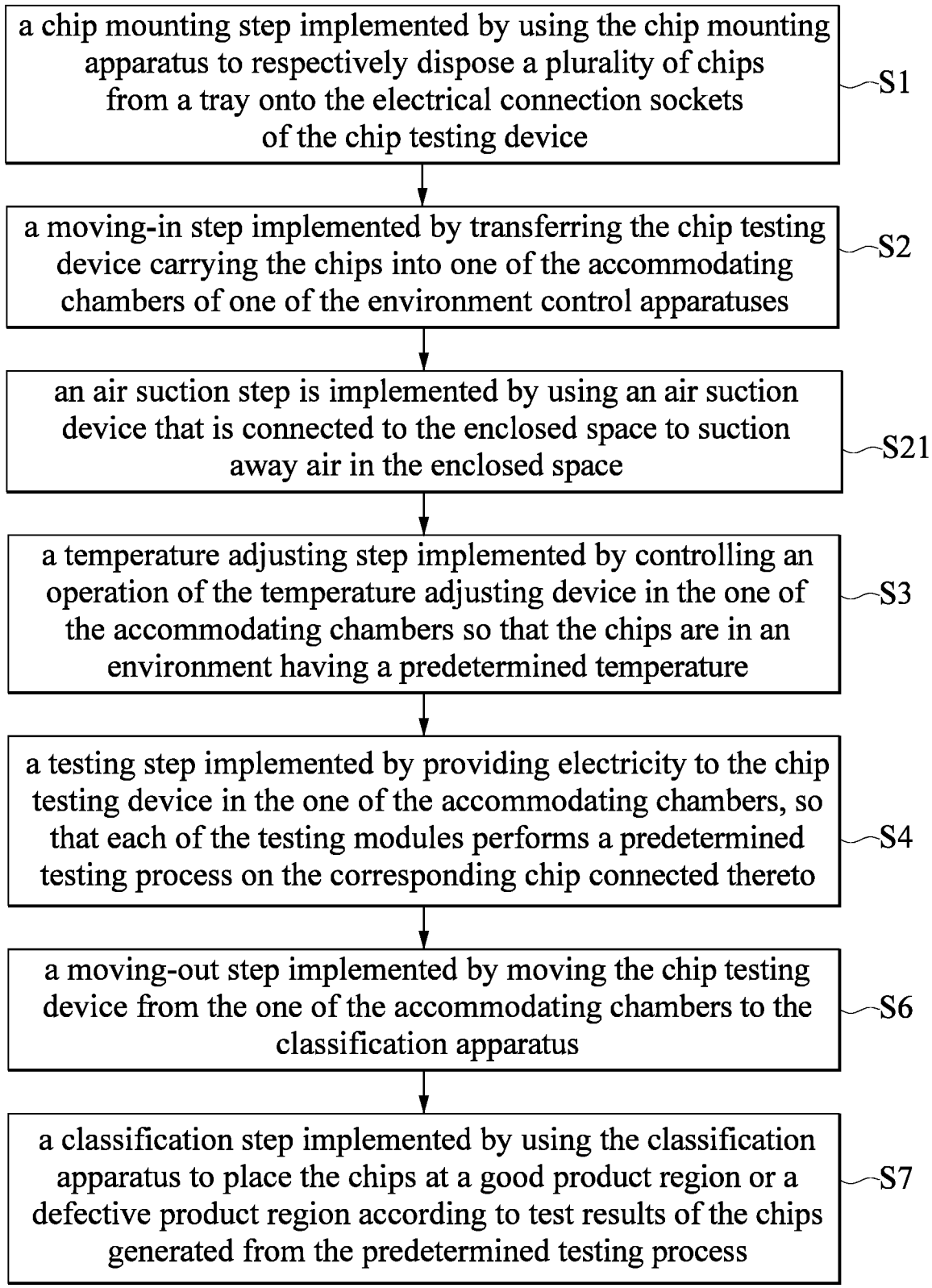
FIG. 25 is a flow chart showing a chip testing method that is implemented by using the chip testing system according to a second embodiment of the present disclosure.

Referring to FIG. 25, FIG. 25 is a flow chart showing a chip testing method that is implemented by using the chip testing system according to a second embodiment of the present disclosure. The chip testing method in the present embodiment further includes an air suction step S21 that is between the moving-in step S2 and the temperature adjusting step S3 and is not disclosed in the first embodiment. Moreover, in the moving-in step S2, the cover E35 of the one of the accommodating chambers E311 is connected to the circuit board 10, so that the cover E35 and the circuit board 10 jointly define an enclosed space SP2 (shown in FIG. 22). After that, the air suction step S21 is implemented by using an air suction device E37 that is connected to the enclosed space SP2 to suction away air in the enclosed space SP2.

As shown in FIG. 22, when the cover E35 and the circuit board 10 jointly define the enclosed space SP2, the electrical connection sockets 2 are arranged in the enclosed space SP2. After the air suction step S21 is implemented, each of the electrical connection sockets 2 is arranged in a substantial vacuum environment. Accordingly, in the implementation of the temperature adjusting step S3, the temperature of the enclosed space SP2 is not easily affected by an external environment, and an environment temperature of the chips C on the electrical connection sockets 2 can be easily maintained at a predetermined temperature.

Figure 26:
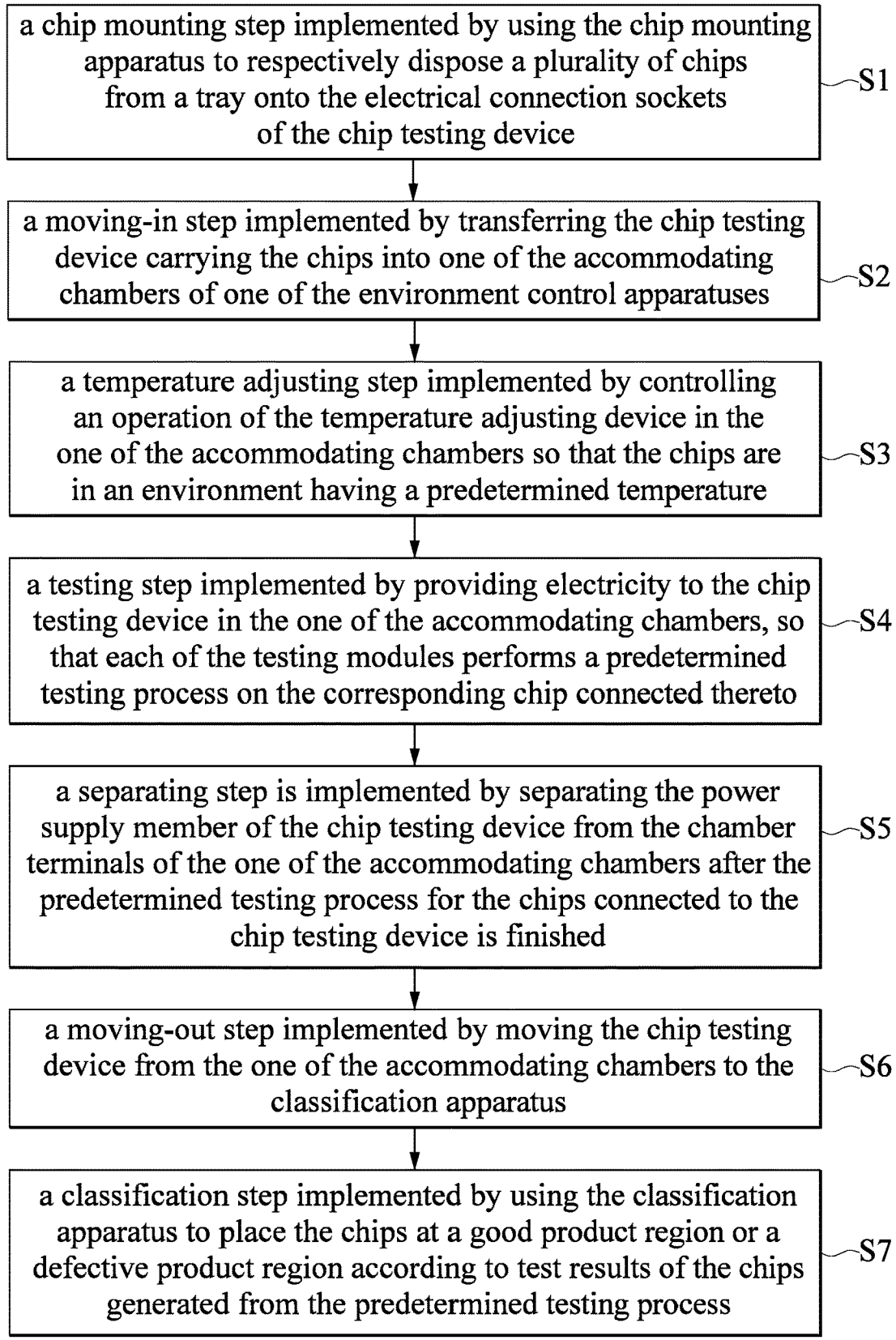
FIG. 26 is a flow chart showing a chip testing method that is implemented by using the chip testing system according to a third embodiment of the present disclosure.

Referring to FIG. 26, FIG. 26 is a flow chart showing a chip testing method that is implemented by using the chip testing system according to a third embodiment of the present disclosure. The chip testing method in the present embodiment further includes a separating step S5 that is between the testing step S4 and the moving-out step S6 and is not disclosed in the above embodiments. Moreover, the separating step S5 is implemented by separating the power supply member 4 of the chip testing device 1 from the chamber terminals E33 of the one of the accommodating chambers E311 after the predetermined testing process for the chips C connected to the chip testing device 1 is finished.

As shown in FIG. 3, FIG. 17, and FIG. 18, the environment control apparatus E3 further includes a plurality of lift devices E38, and each of the accommodating chambers E311 is provided with one of the lift devices E38 therein. Each of the lift devices E38 is connected to the environment status control devices of the central control device E1. Each of the lift devices E38 is controllable by the central control device E1 to move the chip testing device 1 in the corresponding accommodating chamber E311, so that the connection terminals of the power supply member 4 of the chip testing device 1 can be in contact with or be separated from the corresponding chamber terminals E33.

In a practical application, when the chip testing device 1 is transferred into the accommodating chamber E311 by the transferring apparatus E4, the power supply members 4 of the chip testing device 1 can be not in contact with the corresponding chamber terminals E33. Moreover, when any one of the accommodating chambers E311 receiving the chip testing device 1 is detected by the central control device E1, the central control device E1 can control the corresponding lift device E38 to move the chip testing device 1 in the corresponding accommodating chamber E311, so that the connection terminals of the power supply member 4 can be in contact with the corresponding chamber terminals E33. Accordingly, the external power supply apparatus P can provide electricity to the testing modules 30 through the power supply member 4.

In a practical application, the detection manner of the central control device E1 for determining whether any one of the accommodating chambers E311 receives the chip testing device 1 can be changed according to design requirements, and is not limited thereto. For example, the accommodating chamber E311 can be provided with a sensor (e.g., an optical sensor or a mechanical compression sensor) therein, and when the chip testing device 1 is placed into the accommodating chamber E311, the sensor transmits a related signal to the central control device E1, so that the central control device E1 can determine whether the accommodating chamber E311 receives the chip testing device 1 according to the signal from the sensor. The sensor can be used to detect whether the chip testing device 1 is at a predetermined position in the accommodating chamber E311. Specifically, the sensor can transmit a signal to the central control device 1 according to the position of the chip testing device 1 in the accommodating chamber E311, and the central control device 1 can determine whether the chip testing device 1 is at a predetermined position in the accommodating chamber E311 according to the signal from the sensor. Moreover, if the central control device 1 determines that the chip testing device 1 is at a predetermined position in the accommodating chamber E311, the central control device 1 can control the lift device E38 to move. If the central control device 1 determines that the chip testing device 1 is not at the predetermined position in the accommodating chamber E311, the central control device 1 can control an alert device to warn a user. For example, the central control device 1 can control an alerting light to emit light in a specific color, or can control a screen to show an error signal.

In an embodiment of the present disclosure, the power supply member 4 is the receiving antenna, and when the chip testing device 1 is disposed in the accommodating chamber E311, the emitting antenna in the accommodating chamber E311 can be provided to be coupled with the receiving antenna, so that the chip testing device 1 can receive electricity through the power supply member 4. In an embodiment of the present disclosure, only if the chip testing device 1 is at the predetermined position in the accommodating chamber E311, can the receiving antenna be coupled with the emitting antenna, but the present disclosure is not limited thereto.

As shown in FIG. 3 and FIG. 18, each of the temperature adjusting devices E34 has the high temperature contacting structure E34A1, the low temperature contacting structure E34B1, or the contacting structure E343, and when the lift device E38 is controlled to move, the chip testing device 1 and the chips disposed thereon are moved toward or away from the high temperature contacting structure E34A1, the low temperature contacting structure E34B1, or the contacting structure E343 by the lift device E38.

In an embodiment of the present disclosure, the temperature adjusting device E34 is connected to the cover E35, and when the lift device E38 is controlled to move the chip testing device 1 toward the high temperature contacting structure E34A1, the low temperature contacting structure E34B1, or the contacting structure E343 until arriving at the predetermined position, the cover E35 is disposed on the circuit board 10 of the chip testing device 1 so as to jointly define the enclosed space SP2. After that and before the temperature adjusting step S3, the central control device E1 controls the air suction device E37 to suction away the air in the enclosed space SP2 so that the enclosed space SP2 is in a substantial vacuum state. After the temperature adjusting step S3, the temperature of the enclosed space SP2 is not easily affected by an external environment.

In a practical application, when the chip testing device 1 is disposed in the accommodating chamber E311, and the lift device E38 raises the chip testing device 1, the chips C can be not in contact with the high temperature contacting structure E34A1, the low temperature contacting structure E34B1, or the contacting structure E343. Moreover, when the air suction device E37 starts to perform an air suction operation, the chips C are in contact with the high temperature contacting structure E34A1, the low temperature contacting structure E34B1, or the contacting structure E343, but the present disclosure is not limited thereto. In other embodiments of the present disclosure, the chips C can be in contact with the high temperature contacting structure E34A1, the low temperature contacting structure E34B1, or the contacting structure E343 before the air suction device E37 starts to perform the air suction operation.

In the testing step S4, the chip testing device 1 is coupled with or connected to the corresponding emitting antenna or the corresponding chamber terminals through the receiving antenna or the connection terminals, so that the chip testing device 1 can obtain electricity to allow each of the testing modules 30 to test the corresponding chip C.

As shown in FIG. 17 and FIG. 18, the environment control apparatus E3 can further include a plurality of retaining devices E39 arranged in the accommodating chambers E311 to firmly connect the connection terminals of the power supply member 4 of the chip testing device 1 to the chamber terminals E33. Each of the retaining devices E39 is connected to the central control device E1, and is controllable by the central control device E1 so as to limit a range of movement of the chip testing device 1 in the corresponding accommodating chamber E311. The specific structure of the retaining device E39 can be formed according to design requirements. For example, in other embodiments of the present disclosure, the chip testing device 1 can be provided with an engaging hole, and the retaining device E39 can include a hook structure corresponding in shape with the engaging hole, so that when the retaining device E39 is in operation, the hook structure engages in the engaging hole. Or, the retaining device E39 can include a plurality of retractable pins that are arranged in the engaging hole of the chip testing device 1.

Moreover, in an embodiment of the present disclosure, each of the accommodating chambers E311 of each of the environment control apparatuses E3 is provided with the high temperature contacting structure E34A1, the low temperature contacting structure E34B1, or the contacting structure E343, the lift device E38, and the retaining device E39, and the moving-in step S2 of the chip testing method can include: a moving-in chamber step implemented by transferring the chip testing device 1 into one of the accommodating chambers E311; a lifting step implemented by controlling the lift device E38 of the one of the accommodating chambers E311 so as to move the chip testing device 1 toward the contacting structure E34A1, E34B1, or E343; and a locking step implemented by controlling the retaining structure E39 in the one of the accommodating chambers E311 so as to limit a range of movement of the chip testing device 1 in the one of the accommodating chambers E311.

In other words, the chip testing method of the present embodiment can be simply described as the following steps. A plurality of chips C are disposed onto the chip testing device 1; the chip testing device 1 carrying the chips C is moved into one of the accommodating chambers E311; the lift device E38 is controlled to lift the chip testing device 1, so that one side of the chips C is located adjacent to the high temperature contacting structure E34A1, the low temperature contacting structure E34B1, or the contacting structure E343 of the temperature adjusting device E34, and the cover E35 connected to the temperature adjusting device E34 is disposed on the circuit board 10 of the chip testing device 1 to jointly define an enclosed space SP2; and the air suction device E37 is controlled to suction away the air in the enclosed space SP2, so that the one side of the chips C is in contact with the high temperature contacting structure E34A1, the low temperature contacting structure E34B1, or the contacting structure E343, and the temperature adjusting device E34 is controlled at the same time so that the chips C are at the predetermined temperature. Moreover, when the temperature adjusting device E34 is operated, the chip testing device 1 receives electricity, so that the testing modules 30 are operated to test the chips C.

Figure 27:
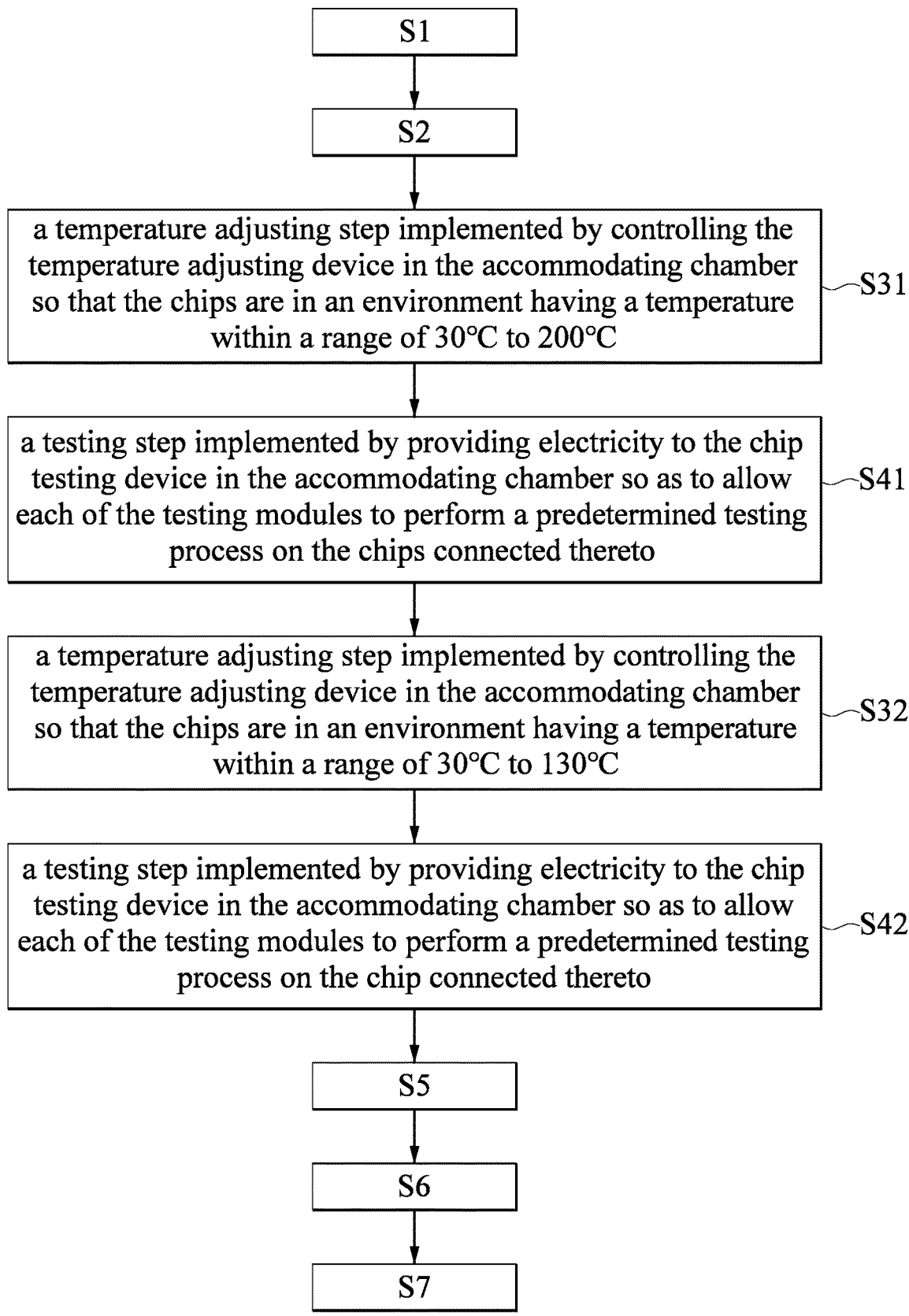
FIG. 27 is a flow chart showing a chip testing method that is implemented by using the chip testing system according to a fourth embodiment of the present disclosure.

Referring to FIG. 27, FIG. 27 is a flow chart showing a chip testing method that is implemented by using the chip testing system according to a fourth embodiment of the present disclosure. The chip testing system E of the present embodiment is configured to test a plurality of memory chips (i.e., the chips C) by implementing the chip testing method. The difference between the chip testing method in the present embodiment and other embodiments of the present disclosure is described as follows. In the present embodiment, the temperature adjusting step S3 and the testing step S4 can be repeatedly implemented for two times after the moving-in step S2 and before the moving-out step S5, and includes a temperature adjusting step S31, a testing step S41, a temperature adjusting step S32, and a testing step S42.

In the temperature adjusting step S31 and the testing step S41 (i.e., the temperature adjusting step S3 and the testing step S4 are implemented for a first time of the two times), the temperature adjusting device E34 in the accommodating chamber E311 is controlled so that the chips C are in an environment having a temperature within a range of 30° C. to 200° C. and are tested by the testing modules 30 with at least one of a reading test, a writing test, and an electrical property test. The temperature adjusting step S31 and the testing step S41 in the present embodiment can be regarded as a burn-in test for the memory chips.

In the temperature adjusting step S32 and the testing step S42 (i.e., the temperature adjusting step S3 and the testing step S4 are implemented for a second time of the two times), the temperature adjusting device E34 of the accommodating chamber E311 is controlled so that the chips C are in an environment having a temperature within a range of 30° C. to 130° C. and are tested by the testing modules 30 with at least one of a reading test, a writing test, and an electrical property test. The temperature adjusting step S32 and the testing step S42 in the present embodiment can be regarded as a high temperature test for the memory chips.

It should be noted that the chip testing method in other embodiments of the present disclosure can further include a moving-out step and a moving-in step between the testing step S41 and the temperature adjusting step S32. Specifically, the moving-out step is implemented by moving the chip testing device 1 from the corresponding accommodating chamber E311, and the moving-in step is implemented by moving the chip testing device 1 into another one of the accommodating chambers E311. In other words, the chip testing device 1 can be tested in two of the accommodating chambers E311 that have different temperatures (one of the different temperatures is within a range of 30° C. to 200° C. and the other one of the different temperatures is within a range of 30° C. to 130° C.), and the two of the accommodating chambers E311 can be arranged in the same environment control apparatus E3 or can be respectively arranged in two of the environment control apparatuses E3.

Figure 28:
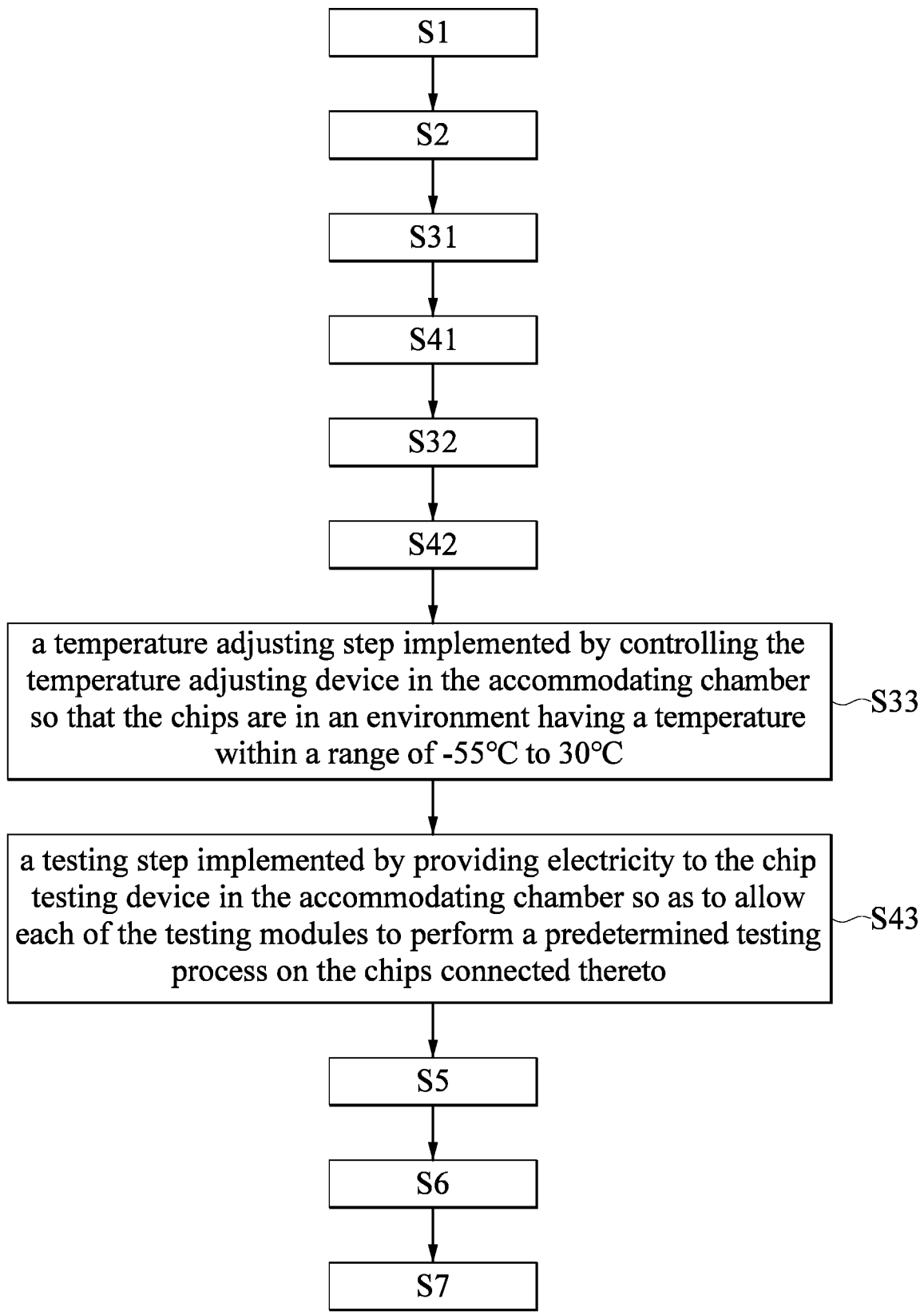
FIG. 28 is a flow chart showing a chip testing method that is implemented by using the chip testing system according to a fifth embodiment of the present disclosure.

Referring to FIG. 28, FIG. 28 is a flow chart showing a chip testing method that is implemented by using the chip testing system according to a fifth embodiment of the present disclosure. The chip testing system E of the present embodiment is configured to test a plurality of memory chips (i.e., the chips C) by implementing the chip testing method. The difference between the chip testing method in the present embodiment and the fifth embodiment shown in FIG. 28 is described as follows. In the present embodiment, the temperature adjusting step S3 and the testing step S4 can be repeatedly implemented for three times after the moving-in step S2 and before the moving-out step S5, and can include a temperature adjusting step S31, a testing step S41, a temperature adjusting step S32, a testing step S42, a temperature adjusting step S33, and a testing step S43.

After the temperature adjusting step S32 and the testing step S42 are implemented, the temperature adjusting step S33 and the testing step S43 (i.e., the temperature adjusting step S3 and the testing step S4 are implemented for a third time of the three times) are implemented by controlling the temperature adjusting device E34 in the accommodating chamber E311 so that the chips C are in an environment having a temperature within a range of −55° C. to 30° C. and are tested by the testing modules 30 with at least one of a reading test, a writing test, and an electrical property test. In other words, the chip testing method in the present embodiment is sequentially implemented by a burn-in test, a high temperature test, and a low temperature test for the memory chips.

Figure 29:
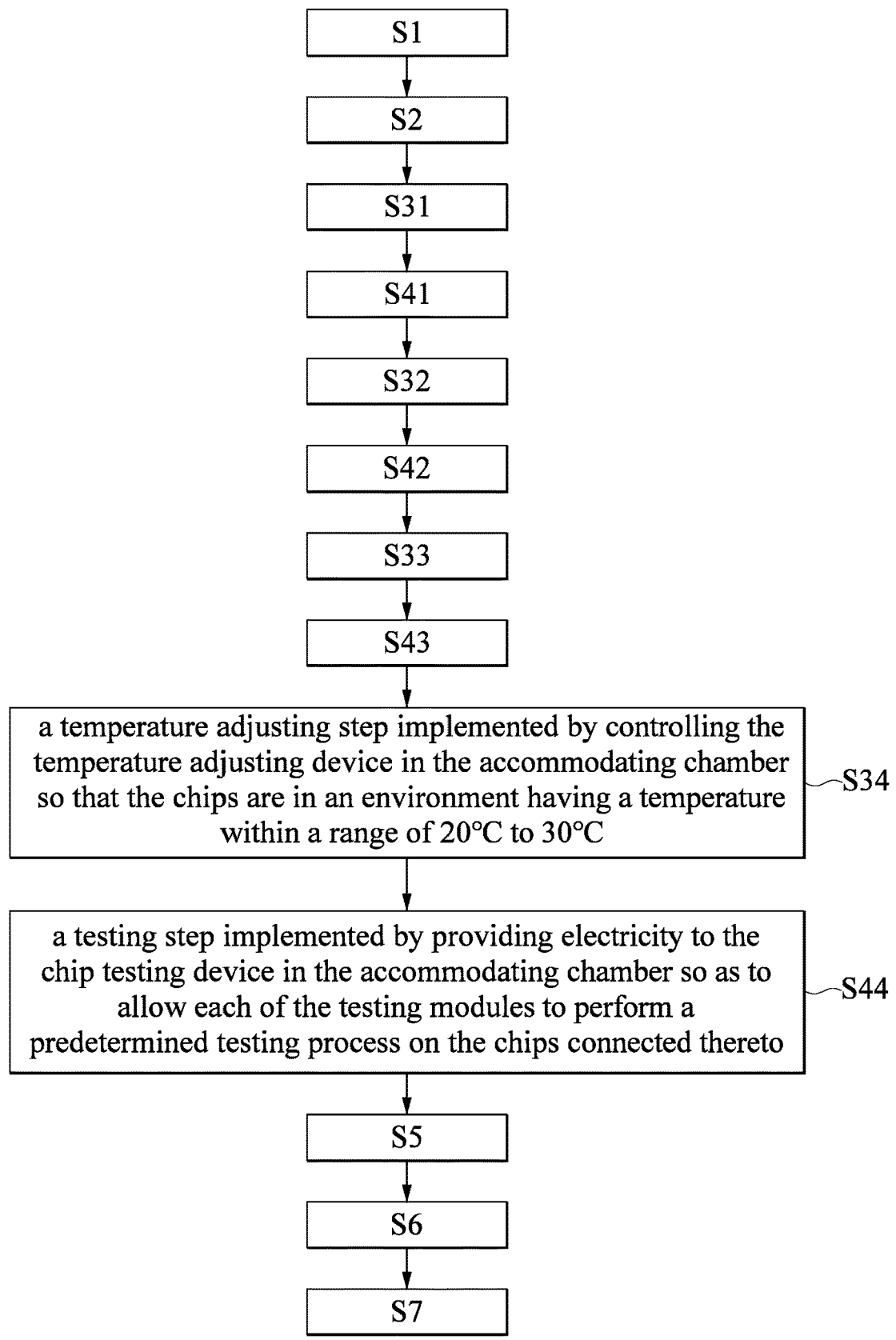
FIG. 29 is a flow chart showing a chip testing method that is implemented by using the chip testing system according to a sixth embodiment of the present disclosure.

Referring to FIG. 29, FIG. 29 is a flow chart showing a chip testing method that is implemented by using the chip testing system according to a sixth embodiment of the present disclosure. The difference between the chip testing method in the present embodiment and the embodiment shown in FIG. 27 is described as follows. In the present embodiment, the temperature adjusting step S3 and the testing step S4 can be repeatedly implemented for four times after the moving-in step S2 and before the moving-out step S5, and can include a temperature adjusting step S31, a testing step S41, a temperature adjusting step S32, a testing step S42, a temperature adjusting step S33, a testing step S43, a temperature adjusting step S34, and a testing step S44.

After the temperature adjusting step S33 and the testing step S43 are implemented, the temperature adjusting step S34 and the testing step S44 (i.e., the temperature adjusting step S3 and the testing step S4 are implemented for a fourth time of the four times) are implemented by controlling the temperature adjusting device E34 in the accommodating chamber E311 so that the chips C are in an environment having a temperature (e.g., an ambient temperature) within a range of 20° C. to 30° C. and are tested by the testing modules 30 with at least one of a reading test, a writing test, and an electrical property test. In other words, the chip testing method in the present embodiment is sequentially implemented by a burn-in test, a high temperature test, a low temperature test, and a normal temperature for the memory chips.

According to the above, each of the temperature adjusting devices E34 of each of the environment control apparatuses E3 of the chip testing system E are provided with the cooler E342 and the heater E341 to implement the chip testing method of the above embodiments. Specifically, the chip testing device 1 can be moved into the accommodating chambers E311 of the environment control apparatus E3 so as to be sequentially in the different environments having different temperatures (e.g., a temperature within a range of 30° C. to 200° C., a temperature within a range of 30° C. to 130° C., a temperature within a range of −55° C. to 30° C., and a temperature within a range of 20° C. to 30° C.) and be tested with at least one of a reading test, a writing test, and an electrical property test. In other words, the chips C can be sequentially tested by a burn-in test, a high temperature test, a low temperature test, and a normal temperature. In a practical application, the sequence of the burn-in test, the high temperature test, the low temperature test, and the normal temperature can be adjusted according design requirements.

Figure 30:
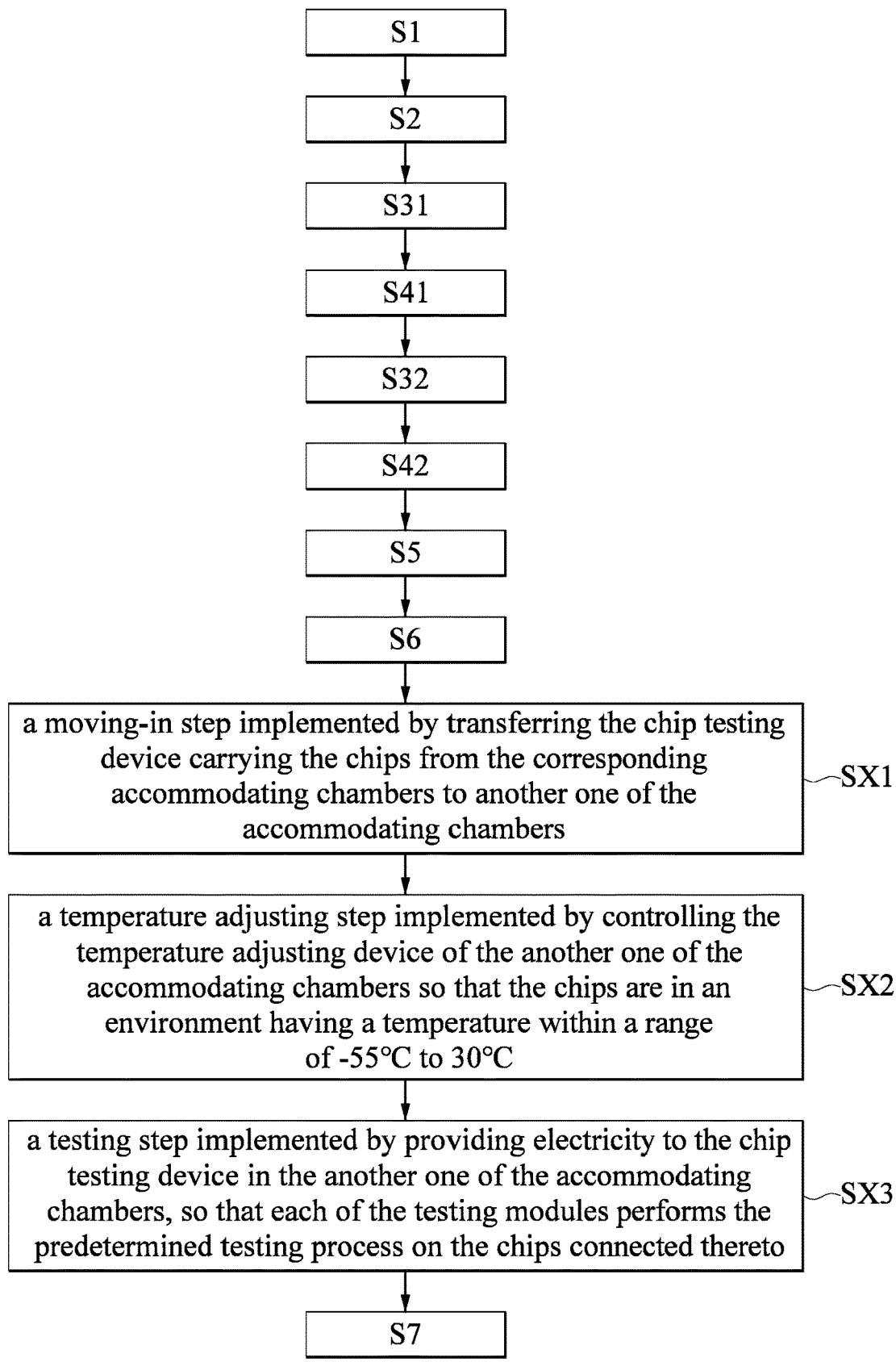
FIG. 30 is a flow chart showing a chip testing method that is implemented by using the chip testing system according to a seventh embodiment of the present disclosure.

Referring to FIG. 30, FIG. 30 is a flow chart showing a chip testing method that is implemented by using the chip testing system according to a seventh embodiment of the present disclosure. The chip testing system E of the present embodiment is configured to test a plurality of memory chips (i.e., the chips C) by implementing the chip testing method. The difference between the chip testing method in the present embodiment and the embodiment shown in FIG. 27 is described as follows. In the present embodiment, the chip testing method further includes the steps between the moving-out step S6 and the classification step S7 as follows: a moving-in step SX1 implemented by transferring the chip testing device 1 carrying the chips C from the corresponding accommodating chambers E311 to another one of the accommodating chambers E311; a temperature adjusting step SX2 implemented by controlling the temperature adjusting device E34 of the another one of the accommodating chambers E311 so that the chips C are in an environment having a temperature within a range of −55° C. to 30° C.; and a testing step SX3 implemented by providing electricity to the chip testing device 1 in the another one of the accommodating chambers E311, so that each of the testing modules 30 performs the predetermined testing process on the chips C connected thereto.

In the chip testing method of the present embodiment, the chip testing device 1 is in one of the accommodating chambers E311 of the environment control apparatus E3 so that the chips C are sequentially in an environment having a temperature within a range of 30° C. to 200° C. and an environment having a temperature within a range of 30° C. to 130° C. and are tested by the testing modules 30 with at least one of a reading test, a writing test, and an electrical property test. After that, the chip testing device 1 is transferred from the one of the accommodating chambers E311 into another one of the accommodating chambers E311, and the two of the accommodating chambers E311 can be arranged in the same environment control apparatus E3 or can be respectively arranged in two of the environment control apparatuses E3. Finally, the temperature adjusting device E34 in the corresponding accommodating chamber E311 is operated so that the chips C on the chip testing device 1 are in an environment having a temperature within a range of −55° C. to 30° C. and are tested by the testing modules 30 with at least one of a reading test, a writing test, and an electrical property test.

The chip testing method of the present embodiment is implemented by the chip testing system E, and each of the accommodating chambers E311 of each of the environment control apparatuses E3 of the chip testing system E is only provided with one of the heating device E34A or the cooling device E34B.

In the chip testing method of the present embodiment, the temperature of any one of the accommodating chambers E311 does not change from a temperature more than 100° C. to a temperature less than 0° C., so that a total time for changing an environment temperature of the chips C to the predetermined high temperature or the predetermined low temperature can be effectively reduced, and a total energy provided by each of the temperature adjusting devices E34 for increasing the temperature of the corresponding accommodating chamber E311 to the predetermined temperature can be effectively reduced.

Figure 31:
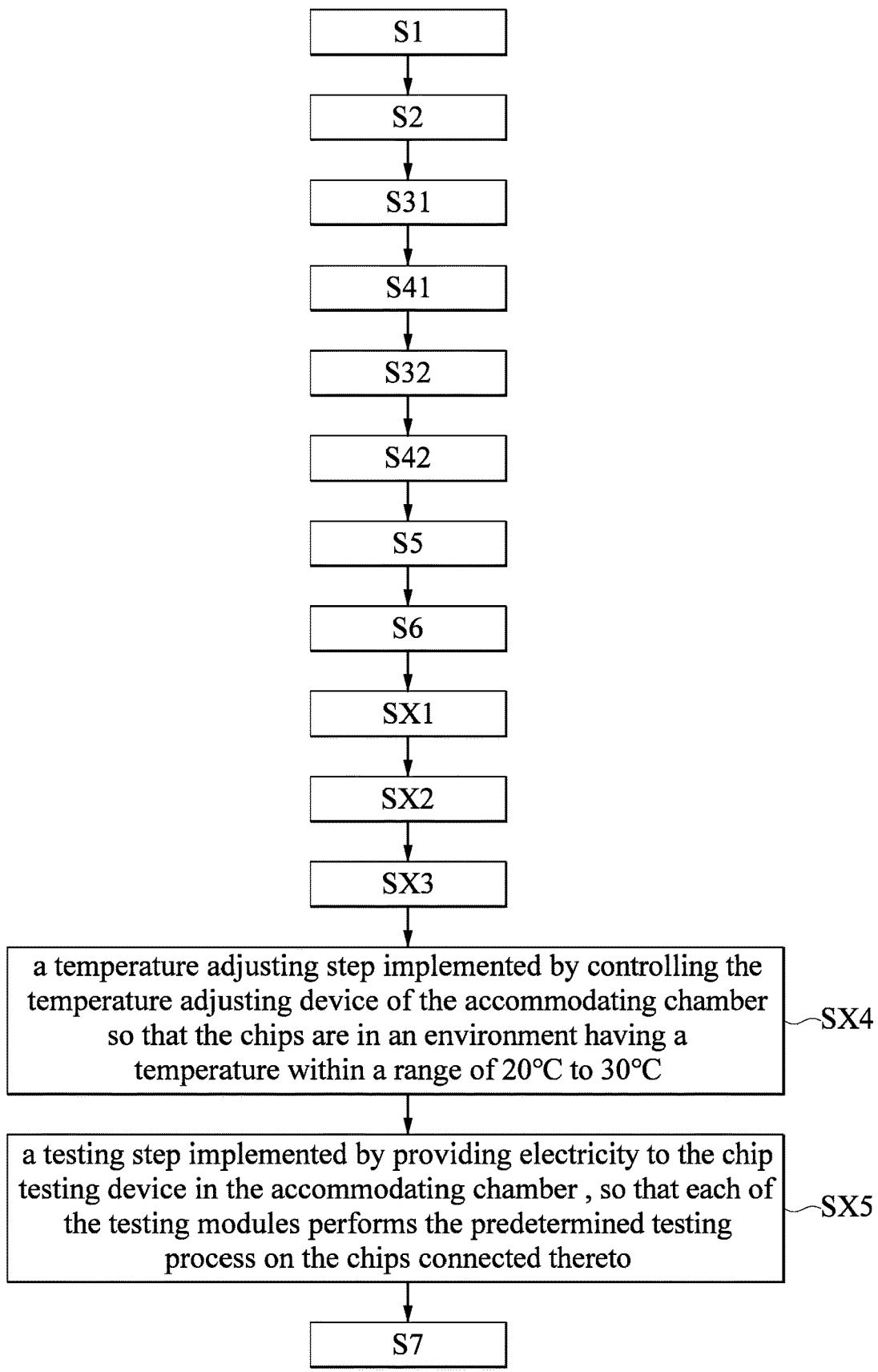
FIG. 31 is a flow chart showing a chip testing method that is implemented by using the chip testing system according to an eighth embodiment of the present disclosure.

Referring to FIG. 31, FIG. 31 is a flow chart showing a chip testing method that is implemented by using the chip testing system according to an eighth embodiment of the present disclosure. The chip testing system E of the present embodiment is configured to test a plurality of memory chips (i.e., the chips C) by implementing the chip testing method. The difference between the chip testing method in the present embodiment and the above embodiments of the present disclosure is described as follows. In the present embodiment, the chip testing method further includes a temperature adjusting step SX4 and the testing step SX5 after the temperature adjusting step SX2 and the testing step SX3. The temperature adjusting step SX4 is implemented by controlling the temperature adjusting device E34 of the accommodating chamber E311 so that the chips C are in an environment having a temperature (e.g., an ambient temperature) within a range of 20° C. to 30° C. The testing step SX5 is implemented by providing electricity to the chip testing device 1 in the accommodating chamber E311, so that each of the testing modules 30 performs the predetermined testing process on the chips C connected thereto. In other words, the chips C in the temperature adjusting step SX2 and the testing step SX3 are tested under a low temperature environment, and the chips C in the temperature adjusting step SX4 and the testing step SX5 are tested under a normal temperature environment.

It is worth mentioning that in other embodiments of the present disclosure, after each of the testing modules 30 performs the predetermined testing process on the chips C on the electrical connection sockets 2 connected thereto, the testing modules 30 can write the test result data and the test parameter data into the corresponding chip C, so that each of the chips C has the test result data and the test parameter data. Moreover, the test result data C2 can be used to present testing states of the chip C in the high temperature test, the burn-in test, the low temperature test, and the normal temperature test; or the test result data can be used to present records of the chip C that passes or does not pass the high temperature test, the burn-in test, the normal temperature test, or the low temperature test. Specifically, after each of the testing steps S41, S42, S43, and S44 (as shown in FIG. 29), the chip testing method further includes a test result writing step. The test result writing step is implemented by storing the test result data of each of the memory chips finishing the predetermined testing process and the corresponding test parameter data into each of the memory chips.

The test parameter data C3 can include: ID number of the chip testing device 1, ID number of the testing module 30, ID number of the electrical connection socket 2, ID number of the environment control apparatus E3, ID number of the accommodating chamber E311, time and temperature in the high temperature test, time and temperature in the burn-in test, time and temperature in the low temperature test, and time and temperature in the normal temperature test.

Since the test result data and the test parameter data are written in the chip C through the testing module 30, when a consumer obtains any one of the chips C, the consumer can confirm the testing state of the chip C by using a relevant apparatus to read the data in the chip C. Moreover, when a production staff receives a chip C sent back from a consumer, the testing state of the chip C can be quickly obtained by reading the test result data and the test parameter data in the chip C, thereby effectively helping the production staff to find defects in the testing process.

In other embodiments of the present disclosure, the chip testing method can include a result writing step after the classification step S7 (as shown in FIG. 29). The result writing step is implemented by storing the test result data of each of the memory chips after finishing the predetermined testing process and the corresponding test parameter data into each of the memory chips. Specifically, when the memory chip carried by the chip testing device 1 finishes all of the tests (e.g., the burn-in test and the high temperature test, or the burn-in test, the high temperature test, the low temperature test, the normal temperature test), the central control device E1 can control the classification apparatus E5 to classify each of the memory chips according to the test result of each of the memory chips. The central control device E1 then controls a related read-write device to perform a related read-write operation to the memory chips classified to the good product region A1 so that the corresponding test result data and test parameter data are stored into each of the memory chips. That is to say, the test result data and test parameter data are only stored in the memory chips classified as good products.

The chip testing method of the present embodiment can include a result writing step before the classification step S7 (as shown in FIG. 29). The result writing step is implemented by storing the test result data and the test parameter data into the each of memory chips passing the predetermined testing process. Specifically, after the memory chip on the chip testing device 1 passes all of the tests (e.g., the burn-in test and the high temperature test; or the high temperature test, the burn-in test, the low temperature test, or the normal temperature test) according to design requirements, the chip testing device 1 would write the test result data and the test parameter data into the memory chip. However, if the memory does not pass at least one of the tests, the chip testing device 1 does not write any test result data and any test parameter data into the memory chip. Accordingly, in the classification step S7, the classification apparatus can quickly determine whether the memory chip passes the tests according to the interior data of the memory chip. If the classification apparatus determines that the memory chip is not written with the data, the classification apparatus would directly classify the memory chip to the defective product region.

In an embodiment of the present disclosure, any of the power supply members including the connection terminals, the connection terminals and the chamber terminals can each be replaced by the receiving antennas and the emitting antennas. Moreover, since the receiving antenna and the emitting antenna are used to transmit electricity in a wireless manner, when the connection terminals and the chamber terminals are replaced by the receiving antennas and the emitting antennas, the processes of the above embodiments for connecting or separating the connection terminals and the chamber terminals can be omitted.

In conclusion, the chip testing system, the chip testing device, and the chip testing method of the present disclosure, when compared to the conventional chip testing apparatus, can have a cost advantage and a better test efficiency. In addition, the chip testing system of the present disclosure is configured to use the chip testing device to carry the chips, and the chip testing device can be moved to allow the chips to be tested under different temperature environments, so that the chips can be disposed on the same chip testing device in the entirety of the testing steps without being repeatedly detached or mounted. Accordingly, the chip testing system of the present disclosure can be used to effectively prevent unexpected damage to the chips. The conventional memory testing apparatus is used to repeatedly detach and mount a memory chip to electrical connection sockets that are distributed in different temperature environments, and as a result, unexpected damage can easily occur in the memory chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip testing device for carrying a plurality of chips and being transferred among a plurality of working stations through a transferring device, the chip testing device comprising:
 a circuit board having a first board surface and a second board surface respectively defined by two opposite sides thereof, wherein the circuit board includes a plurality of positioning holes and a plurality of circuit board screwing holes, each of the positioning holes does not penetrate through the circuit board, and each of the circuit board screwing holes penetrates through the circuit board;
 a fixing assembly including a first fixing member and a second fixing member, wherein the first fixing member is disposed on the first board surface, the second fixing member is disposed on the second board surface, the first fixing member includes a plurality of first screwing holes, the second fixing member includes a plurality of second screwing holes, and the circuit board holes and the second screwing holes are correspondingly disposed, and wherein a plurality of screwing members are screwed at the first screwing holes, the circuit board holes, and the second screwing holes, and the circuit board is fixed between the first fixing member and the second fixing member;
 a plurality of electrical connection sockets, wherein each of the electrical connection sockets includes a socket body, wherein one side of each of the socket bodies is configured to carry one of the chips, each of the socket bodies includes at least two positioning members at another side of each of the socket bodies, the at least two positioning members are engaged with the positioning holes of the circuit board, and each of the electrical connection sockets is fixed onto the first board surface of the circuit board, and wherein the first fixing member includes a plurality of pressing structures, the pressing structures correspondingly press on a part of the electrical connection sockets, each of the electrical connection sockets is pressed by the first fixing member to be fixed onto the first board surface of the circuit board, the first fixing member includes a plurality of thru-holes, and a part of each of the electrical connection sockets is correspondingly exposed from one of the thru-holes;

a control set disposed on the second board surface of the circuit board, wherein the control set includes a plurality of testing modules, and each of the testing modules is connected to a part of the socket groups, and wherein the second fixing member includes a plurality of avoidance holes, and parts of the testing modules penetrate through the avoidance holes; and at least one power supply member connected to the circuit board, wherein the chip testing device is connected to an external power supply apparatus through the at least one power supply member so as to receive electricity for an operation of each of the testing modules, and the external power supply apparatus is connected to at least one of the working stations, and wherein when the chip testing device receives electricity provided from the external power supply apparatus through the at least one power supply member, each of the testing modules is allowed to perform a predetermined testing process on at least one of the chips disposed on at least one of the electrical connection sockets of the corresponding socket group connected thereto.

2. The chip testing device according to claim 1, wherein each of the testing modules includes a pattern generator (PG), a device power supply (DPS), and a driver, wherein each of the chips is a memory chip, and the predetermined testing process includes at least one of a reading test, a writing test, and an electrical property test, wherein the electrical connection sockets are divided into a plurality of socket groups, and each of the socket groups has at least one of the electrical connection sockets, and wherein the testing modules are connected to the socket groups, and each of the testing modules is connected to at least one of the electrical connection sockets of the corresponding socket group.

3. The chip testing device according to claim 2, wherein each of the pressing structures is detachably fixed to the first fixing member, the first fixing member includes a plurality of group accommodating holes, and each of the group accommodating holes is configured to accommodate the electrical connection sockets of the same one of the socket groups.

4. The chip testing device according to claim 3, wherein the circuit board has a plurality of first contacting structures on the second board surface of the circuit board, each of the testing modules includes at least one second contacting structure, and the at least one second contacting structure of each of the testing modules detachably and mutually contacts one of the first contacting structures.

5. The chip testing device according to claim 1, wherein the at least one power supply member includes a plurality of connection terminals disposed on the first board surface of the circuit board, and the connection terminals are exposed from the first fixing member, wherein the connection terminals are configured to be connected to a plurality of chamber terminals of one of the working stations, and wherein when the connection terminals are connected to the chamber terminals, the external power supply apparatus is capable of providing electricity to the chip testing device.

6. The chip testing device according to claim 1, further comprising at least one first data transmission terminal disposed on the circuit board, wherein the at least one first data transmission terminal is exposed from the first fixing member and configured to be in contact with at least one second data transmission terminal of one of the working stations to mutually transmit data.

7. The chip testing device according to claim 1, wherein after each of the testing modules performs the predetermined testing process on the at least one of the chips disposed on the at least one of the electrical connection sockets of the corresponding socket group connected thereto, test result data and test parameter data of each of the chips are stored into each of the chips through the corresponding testing module, so that each of the chips has the test result data and the test parameter data.

8. The chip testing device according to claim 1, wherein each of the electrical connection sockets includes:

a socket body having a top wall and an annular wall, wherein the top wall has an opening, one end of the annular wall is connected to a peripheral edge of the top wall, and another end of the annular wall is abutted against the circuit board, and wherein the top wall, the annular wall, and the circuit board jointly define an accommodating slot, the top wall has an outer surface and an inner surface respectively defined by two opposite sides thereof, and the inner surface is arranged in the accommodating slot;

a supporting structure abutted against the circuit board and arranged in the accommodating slot, wherein the supporting structure includes a plurality of positioning holes, and a number of the at least two positioning members disposed at each of the positioning holes of the supporting structure is one;

a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips, and wherein the lift structure has a plurality of connection holes penetrating through the base portion and the carrying portion;

at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and a plurality of probe assemblies connected to the supporting structure through one end of the probe assemblies, wherein another end of the probe assemblies is abutted against a plurality of electrical contacting structures of the circuit board and is arranged in the connection holes, wherein in each of the electrical connection sockets, when the chip receiving slot receives the corresponding chip, and the retaining portions are not pressed by a pressing device, the probe assemblies in the connection holes are not in contact with a plurality of electrical connection portions of the corresponding chip, and wherein in each of the electrical connection sockets, when the chip receiving slot receives the corresponding chip, and the retaining portions are pressed to move into the socket body by the pressing device, the probe assemblies are abutted against the electrical connection portions, so that the probe assemblies and the corresponding chip are connected to each other.

9. A chip testing system, comprising:

a chip testing device including:

a circuit board having a first board surface and a second board surface respectively defined by two opposite sides thereof, wherein the circuit board includes a plurality of positioning holes and a plurality of circuit board screwing holes, each of the positioning holes does not penetrate through the circuit board, and each of the circuit board screwing holes penetrates through the circuit board;

a fixing assembly including a first fixing member and a second fixing member, wherein the first fixing member is disposed on the first board surface, the second fixing member is disposed on the second board surface, the first fixing member includes a plurality of first screwing holes, the second includes a plurality of second screwing holes, and the circuit board holes and the second screwing holes are correspondingly disposed, and wherein a plurality of screwing members are screwed at the first screwing holes, the circuit board holes, and the second screwing holes, and the circuit board is fixed between the first fixing member and the second fixing member;

a plurality of electrical connection sockets, wherein each of the electrical connection sockets includes a socket body, wherein one side of each of the socket bodies is configured to carry one of the chips, each of the socket bodies includes at least two positioning members at another side of each of the socket bodies, the at least two positioning members are engaged with the positioning holes of the circuit board, and each of the electrical connection sockets is fixed onto the first board surface of the circuit board, and wherein the first fixing member includes a plurality of pressing structures, the pressing structures correspondingly press on a part of the electrical connection sockets, each of the electrical connection sockets is pressed by the first fixing member to be fixed onto the first board surface of the circuit board, the first fixing member includes a plurality of thru-holes, and a part of each of the electrical connection sockets is correspondingly exposed from one of the thru-holes;

a control set disposed on the second board surface of the circuit board, wherein the control set includes a plurality of testing modules, and each of the testing modules is connected to a part of the socket groups, and wherein the second fixing member includes a plurality of avoidance holes, and parts of the testing modules penetrate through the avoidance holes; and at least one power supply member connected to the circuit board;

a central control device; and an environment control apparatus including:

an apparatus body including a plurality of accommodating chambers and configured to be connected to an external power supply apparatus, wherein each of the accommodating chambers is provided with a power supply component therein that is connected to the external power supply apparatus;

an air suction device connected to each of the accommodating chambers and the central control device, wherein the air suction device is controllable by the central control device to suction away air around the chips carried by the chip testing device; and a plurality of temperature adjusting devices disposed on the apparatus body, wherein a number of the temperature adjusting devices disposed in each of the accommodating chambers is one, and wherein each of the temperature adjusting devices is controllable by the central control device to increase or decrease a temperature around the chips carried by the chip testing device, wherein when the chip testing device is disposed in one of the accommodating chambers, the external power supply apparatus is configured to provide electricity to the chip testing device through the power supply component in the accommodating chamber and the power supply member of the chip testing device, and wherein when the external power supply apparatus provides electricity to the chip testing device, each of the testing modules is configured to perform a predetermined testing process on at least one of the chips carried by the at least one of the electrical connection sockets.

10. The chip testing system according to claim 9, wherein each of the testing modules includes a pattern generator (PG), a device power supply (DPS), and a driver, wherein each of the chips is a memory chip, and the predetermined testing process includes at least one of a reading test, a writing test, and an electrical property test, wherein the electrical connection sockets are divided into a plurality of socket groups, and each of the socket groups has at least one of the electrical connection sockets, and wherein the testing modules are connected to the socket groups, and each of the testing modules is connected to at least one of the electrical connection sockets of the corresponding socket group.

11. The chip testing system according to claim 10, wherein each of the pressing structures is detachably fixed to the first fixing member, the first fixing member includes a plurality of group accommodating holes, and each of the group accommodating holes is configured to accommodate at least one of the electrical connection sockets of one of the socket groups, each of the pressing structures is in a fence shape and includes a plurality of thru-holes that respectively correspond in position to the electrical connection sockets, and a part of each of the electrical connection sockets is exposed from the corresponding thru-hole.

12. The chip testing system according to claim 11, wherein the circuit board has a plurality of first contacting structures on the second board surface of the circuit board, each of the testing modules includes at least one second contacting structure, and the at least one second contacting structure of each of the testing modules is detachably in contact with one of the first contacting structures.

13. The chip testing system according to claim 9, wherein the at least one power supply member includes a plurality of connection terminals disposed on the first board surface of the circuit board, and the connection terminals are exposed from the first fixing member, wherein each of the accommodating chambers is provided with a plurality of chamber terminals therein, and wherein when the connection terminals are connected to the chamber terminals in one of the accommodating chambers, the external power supply apparatus is capable of providing electricity to the chip testing device.

14. The chip testing system according to claim 9, wherein the chip testing device further includes at least one first data transmission terminal disposed on the circuit board, the at least one first data transmission terminal is exposed from the first fixing member, each of the accommodating chambers includes at least one second data transmission terminal connected to the central control device, and wherein the at least one first data transmission terminal is configured to be in contact with the at least one second data transmission terminal of each of the accommodating chambers, and the chip testing device and the central control device are configured to mutually transmit data.

15. The chip testing system according to claim 9, wherein after each of the testing modules performs the predetermined testing process on the at least one of the chips disposed on the at least one of the electrical connection sockets of the corresponding socket group connected thereto, test result data and test parameter data of each of the chips are stored into each of the chips through the corresponding testing module, so that each of the chips has the test result data and the test parameter data.

16. The chip testing system according to claim 9, wherein each of the electrical connection sockets includes:
- a socket body having a top wall and an annular wall, wherein the top wall has an opening, one end of the annular wall is connected to a peripheral edge of the top wall, and another end of the annular wall is abutted against the circuit board, and wherein the top wall, the annular wall, and the circuit board jointly define an accommodating slot, the top wall has an outer surface and an inner surface respectively defined by two opposite sides thereof, and the inner surface is arranged in the accommodating slot;
- a supporting structure abutted against the circuit board and arranged in the accommodating slot, wherein the supporting structure includes a plurality of positioning holes, and a number of the at least two positioning members disposed at each of the positioning holes of the supporting structure is one;
- a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips, and wherein the lift structure has a plurality of connection holes penetrating through the base portion and the carrying portion;
- at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and
- a plurality of probe assemblies connected to the supporting structure through one end of the probe assemblies, wherein another end of the probe assemblies is abutted against a plurality of electrical contacting structures of the circuit board and is arranged in the connection holes, wherein in each of the electrical connection sockets, when the chip receiving slot receives the corresponding chip, and the retaining portions are not pressed by a pressing device, the probe assemblies in the connection holes are not in contact with a plurality of electrical connection portions of the corresponding chip, and wherein in each of the electrical connection sockets, when the chip receiving slot receives the corresponding chip, and the retaining portions are pressed to move into the socket body by the pressing device, the probe assemblies are abutted against the electrical connection portions, so that the probe assemblies and the corresponding chip are connected to each other.

17. The chip testing system according to claim 9, wherein each of the accommodating chambers includes a cover, and wherein when the chip testing device is disposed in one of the accommodating chambers and the chip testing device is provided with electricity, the cover of each of the accommodating chamber covers on the first fixing chamber, the cover, the first fixing member, and the circuit board jointly define an enclosed space, the electrical connection sockets are correspondingly in the enclosed space, and the air suction device is controllable to suction away air in the enclosed space.

18. The chip testing system according to claim 17, wherein each of the accommodating chambers is provided with a lift device disposed therein, and each of the lift devices is connected to the central control device, and wherein each of the lift devices is controllable by the central control device so that the chip testing device moves toward or away from the cover.

* * * * *